United States Patent
Palaniappa et al.

(10) Patent No.: US 6,394,820 B1
(45) Date of Patent: May 28, 2002

(54) PACKAGED DEVICE ADAPTER ASSEMBLY AND MOUNTING APPARATUS

(75) Inventors: Ilavarasan Palaniappa, Apple Valley; Mickiel Fedde, Eagan, both of MN (US)

(73) Assignee: Ironwood Electronics, Inc., Eagan, MN (US)

( * ) Notice: Subject to any disclaimer, the term of this patent is extended or adjusted under 35 U.S.C. 154(b) by 0 days.

(21) Appl. No.: 09/685,480

(22) Filed: Oct. 10, 2000

Related U.S. Application Data

(63) Continuation-in-part of application No. 09/418,388, filed on Oct. 14, 1999.

(51) Int. Cl.⁷ .................................................. H01R 9/09
(52) U.S. Cl. ........................................... 439/83; 439/70
(58) Field of Search ........................... 439/71, 83, 876, 439/70, 74

(56) References Cited

U.S. PATENT DOCUMENTS

| | | |
|---|---|---|
| 2,578,288 A | 12/1951 | Cook |
| 2,951,817 A | 9/1960 | Myers |
| 3,229,756 A | 1/1966 | Keresztury |
| 3,728,509 A | 4/1973 | Shimojo |
| 3,760,342 A | 9/1973 | Prouty et al. |
| 3,870,385 A | 3/1975 | Avakian et al. |
| 3,971,610 A | 7/1976 | Buchoff et al. |
| 4,295,699 A | 10/1981 | DuRocher |
| 4,514,784 A | 4/1985 | Williams et al. |
| 4,550,959 A | 11/1985 | Grabbe et al. |
| 4,655,524 A | 4/1987 | Etzel |
| 4,668,957 A | 5/1987 | Spohr |
| 4,678,250 A * | 7/1987 | Romine et al. ............... 439/83 |
| 4,729,166 A | 3/1988 | Lee et al. |
| 4,754,546 A | 7/1988 | Lee et al. |
| 4,862,076 A | 8/1989 | Renner et al. |
| 4,923,739 A | 5/1990 | Jin et al. |
| 5,074,799 A | 12/1991 | Rowlette, Sr. |
| 5,123,849 A | 6/1992 | Deak et al. |
| 5,127,837 A | 7/1992 | Shah et al. |
| 5,129,833 A | 7/1992 | Rowlette, Sr. |
| 5,137,462 A | 8/1992 | Casey et al. |
| 5,140,405 A | 8/1992 | King et al. |
| 5,155,661 A | 10/1992 | Nagesh et al. |

(List continued on next page.)

FOREIGN PATENT DOCUMENTS

EP 0 905 826 A2 3/1999

OTHER PUBLICATIONS

Ironwood Electronics, Inc. VLSI Interconnection Specialists Catalog XII (pp. 84, 110) (product on p. 110 available at least as early as Oct. 4, 1998).

*Primary Examiner*—Tulsidas Patel
*Assistant Examiner*—Phuong K T Dinh
(74) *Attorney, Agent, or Firm*—Mueting, Raasch & Gebhardt, P.A.

(57) ABSTRACT

A pluggable mounting apparatus provides for mounting a mountable structure having a plurality of contact elements on a surface thereof to a target having a plurality of contact elements on a surface thereof. The pluggable mounting apparatus includes a pin array portion and a mounting base having a defined cavity sized to receive at least a portion of a body member of the pin array portion. The mounting apparatus further includes a conductive element layer, e.g., a conductive elastomer layer, positioned in the cavity for electrical contact with a plurality of pin contact elements extending from an end of the body member of the pin array portion when the portion of the body member of the pin array portion is received in the cavity. An adapter apparatus usable with the mounting apparatus is also provided. The adaptor apparatus also uses a conductive element layer, e.g., a conductive elastomer layer.

25 Claims, 16 Drawing Sheets

U.S. PATENT DOCUMENTS

| | | | |
|---|---|---|---|
| 5,163,837 A | 11/1992 | Rowlette, Sr. | |
| 5,286,218 A | * 2/1994 | Sakurai et al. | 439/444 |
| 5,313,099 A | 5/1994 | Tata et al. | |
| 5,318,456 A | 6/1994 | Mori | |
| 5,340,318 A | 8/1994 | Kunihiro | |
| 5,377,900 A | 1/1995 | Bergmann | |
| 5,387,861 A | 2/1995 | Neiderhofer | |
| 5,389,819 A | 2/1995 | Matsuoka | |
| 5,397,240 A | 3/1995 | Herard | |
| 5,397,245 A | 3/1995 | Roebuck et al. | |
| 5,397,919 A | 3/1995 | Tata et al. | |
| 5,418,471 A | 5/1995 | Kardos | |
| 5,432,679 A | 7/1995 | Grabbe | |
| 5,445,526 A | 8/1995 | Hoshino et al. | |
| 5,468,158 A | 11/1995 | Roebuck et al. | |
| 5,473,510 A | 12/1995 | Dozier, II | |
| 5,477,160 A | 12/1995 | Love | |
| 5,528,462 A | 6/1996 | Pendse | |
| 5,548,223 A | 8/1996 | Cole et al. | |
| 5,566,052 A | 10/1996 | Hughes | |
| 5,636,996 A | 6/1997 | Johnson et al. | |
| 5,662,163 A | 9/1997 | Mira | |
| 5,667,870 A | 9/1997 | McCullough | |
| 5,691,041 A | 11/1997 | Frankeny et al. | |
| 5,699,227 A | 12/1997 | Kolman et al. | |
| 5,710,459 A | 1/1998 | Teng et al. | |
| 5,712,768 A | 1/1998 | Werther | |
| 5,730,620 A | 3/1998 | Chan et al. | |
| 5,735,698 A | 4/1998 | Bakker et al. | |
| 5,741,141 A | 4/1998 | O'Malley | |
| 5,742,481 A | 4/1998 | Murphy et al. | |
| 5,745,346 A | 4/1998 | Ogawa et al. | |
| 5,766,022 A | 6/1998 | Chapin et al. | |
| 5,770,891 A | 6/1998 | Frankeny et al. | |
| 5,783,461 A | 7/1998 | Hembree | |
| 5,793,618 A | 8/1998 | Chan et al. | |
| 5,805,424 A | 9/1998 | Purinton | |
| 5,810,607 A | 9/1998 | Shih et al. | |
| 5,819,406 A | 10/1998 | Yoshizawa et al. | |
| 5,829,988 A | 11/1998 | McMillan et al. | |
| 5,833,471 A | 11/1998 | Selna | |
| 5,859,538 A | 1/1999 | Self | |
| 5,876,219 A | * 3/1999 | Taylor et al. | 439/74 |
| 5,879,172 A | 3/1999 | McKenna-Olson et al. | |
| 5,892,245 A | 4/1999 | Hilton | |
| 5,893,765 A | 4/1999 | Farnworth | |
| 5,896,037 A | 4/1999 | Kudla et al. | |
| 5,923,176 A | 7/1999 | Porter et al. | |
| 5,982,635 A | 11/1999 | Menzies et al. | |

* cited by examiner

PACKAGED DEVICE ADAPTER ASSEMBLY AND MOUNTING APPARATUS

CROSS REFERENCE TO RELATED APPLICATIONS

This is a continuation-in-part of U.S. patent application Ser. No. 09/418,388, filed Oct. 14, 1999.

FIELD OF THE INVENTION

The present invention relates to electrical adapters and mounting apparatus. More particularly, the present invention pertains to adapters for packaged integrated circuit devices, e.g., ball grid array packages, flip chip packages, land grid array packages, etc., and mounting apparatus that may be used therewith.

BACKGROUND OF THE INVENTION

Certain types of integrated circuit packages are becoming increasingly popular due to their occupancy area efficiency. In other words, they occupy less area on a target board on which they are mounted while providing a high density of contact terminals. For example, one such high density package type is a ball grid array package. Generally, ball grid array packages contain an integrated circuit having its die bond pads electrically connected to respective conductive solder spheres that are distributed on the bottom surface of the package in an array. A target printed circuit board typically has formed on its surface a corresponding array of conductive pads which are aligned with the array of solder spheres for electrically mounting the ball grid array package on the target board. The target board typically includes other conductive traces and elements which lead from the array of conductive pads used for mounting the ball grid array package to other circuitry on the board for connecting various components mounted thereon. Typically, to mount such a ball grid array package to a target board, the package is positioned with the array of solder spheres corresponding to the array of conductive pads on the target board. The resulting structure is then heated until the solder spheres are melted and fused to the conductive pads of the target board.

Such area efficient packaging, e.g., ball grid array packages or land grid array packages, provide a high density of terminals at a very low cost. Also, this packaging provides for limited lead lengths. The limited lead lengths may reduce the risk of damage to such leads of the package, may provide for higher speed product, etc.

Generally, circuit boards and/or components mounted thereon are tested by designers as the circuit boards are being developed. For example, for a designer to test a circuit board and/or a ball grid array package mounted thereon, the designer must first electrically connect the solder balls on the ball grid array package to the target circuit board. As described above, this generally includes mounting the ball grid array package on the target board and heating the solder spheres to fuse the solder spheres to the conductive pads of the target board. Therefore, the package may be prevented from being used again. It is desirable for various reasons to use package adapters for mounting the packages and reuse ball grid array packages after testing. For example, such ball grid array packages may be relatively expensive. Further, for example, once attached, the solder spheres are not accessible for testing. In addition, it is often difficult to rework the circuit board with the packages soldered thereon.

Various adapters for ball grid array packages which electrically connect a ball grid array package to a target printed circuit board without requiring that the solder balls on the ball grid array package be fused to the target board are known. For example, one such adapter is shown in U.S. Pat. No. 5,892,245 to Hilton, issued Apr. 6, 1999 and entitled, "Ball Grid Array Package Emulator." However, the high density of terminals for certain packages, e.g., ball grid array packages, lead to various interconnect problems for adapters being used with such packages. For example, such a high density of terminals, e.g., solder spheres, of such packaged devices may lead to isolation problems between conductive elements of conventional adapters used for connecting the packages to the target board. Further, many adapters require the provision of structure on the target board for mechanically fastening an adapter thereto. For example, in many cases the target board is required to have holes defined therein for receiving fastening devices to mechanically mount the electrical adapter to the target board. Yet further, alignment of the contact terminals of the packaged device, e.g., solder spheres, to the contact pads of the target board may be problematic when an electrical adapter is used. Still further, space limitations may prevent use of certain types of adaptors directly on a target board such as those including test probes.

SUMMARY OF THE INVENTION

The present invention provides packaged device adapter assemblies preferably useable for high density integrated circuit packages, e.g., ball grid array packages, flip-chip packages, chip scale packages, land grid array packages, etc., and also pluggable mounting apparatus, e.g., zero insertion force pluggable assemblies, such as may be used with such adapter assemblies.

A pluggable mounting apparatus according to the present invention provides for mounting a mountable structure having a plurality of contact elements on a surface thereof to a target having a plurality of contact elements on a surface thereof. The pluggable mounting apparatus includes a pin array portion comprising a body member extending along a mounting axis between a first end and a second end. The pin array portion includes a plurality of pin contact elements for electrical connection with the plurality of contact elements of the surface of the mountable structure. Further, at least portions of the plurality of pin contact elements extend from the second end of the body member.

The mounting apparatus further includes a mounting base including a base member and a wall member extending therefrom defining a cavity along the mounting axis sized to receive at least a portion of the body member of the pin array portion. The base member is positioned orthogonal to the mounting axis and includes a first set of contact elements and a second set of contact elements. The first and second sets of contact elements are electrically connected and disposed on opposing sides of the base member. The first set of contact elements is located within the cavity and the second set of contact elements is for electrical connection with the plurality of contact elements on the surface of the target.

Yet further, the mounting apparatus includes a conductive element layer that includes a plurality of arranged conductive elements. The conductive element layer is positioned in the cavity for electrical contact between the plurality of arranged conductive elements and the first set of contact elements and also for electrical contact between the plurality of arranged conductive elements and the portions of the plurality of pin contact elements extending from the second end of the body member of the pin array portion when the portion of the body member of the pin array portion is received in the cavity.

In one embodiment of the apparatus, the mounting apparatus further comprises an alignment structure positionable in the cavity adjacent the base member. The alignment structure includes an opening to receive and align the conductive element layer within the cavity. In another embodiment, the alignment structure includes one or more openings configured as a function of the portions of the plurality of pin contact elements extending from the second end of the body member. The one or more openings guide the portions of the plurality of pin contact elements for contact with the conductive element layer within the cavity. In yet another embodiment, the alignment structure includes an opening sized such that the alignment structure makes contact with the second end of the body member of the pin array portion when the at least a portion of the body member of the pin array portion is received in the cavity.

In other embodiments of the apparatus, the conductive element layer may be a conductive elastomer layer, the plurality of pin contact elements (e.g., flat head dual barb pins) extending from the second end of the body member may terminate in a flat end lying orthogonal to the mounting axis for contact with the conductive element layer, and/or the plurality of pin contact elements may include a contact pin element extending through the body member from the first end to the second end and terminating beyond the second end at a pin contact end for contact with the conductive element layer.

In yet another embodiment, the mountable structure includes a test probe adaptor structure having a plurality of contact elements on a surface thereof. The plurality of pin contact elements include a plurality of contact regions for electrical contact with the plurality of contact elements on the surface of the test probe adaptor structure.

A pluggable apparatus according to the present invention includes a body member extending along an axis thereof between a first end and a second end and a plurality of pin contact elements. Each pin contact element extends through the body member from the first end to the second end terminating beyond the second end at a pin contact end. At least one pin contact end is a flat end lying orthogonal to the axis.

In other embodiments of the pluggable apparatus, one or more of the plurality of pin contact elements may include a barb portion at the first end of the body member, one or more of the plurality of pin contact elements may include a barb portion between the first end and second end of the body member, and/or one or more of the plurality of pin contact elements are pins having a flat end and dual barb portions.

A mounting apparatus according to the present invention is also described. The mounting apparatus includes a mounting base including a base member and a wall member extending therefrom. The base member and wall member define a cavity along a mounting axis sized to receive a structure having a plurality of pins extending therefrom. The base member is positioned orthogonal to the mounting axis and comprises a first set of contact elements within the cavity electrically connected to a second set of contact elements. The first and second sets of contact elements are disposed on opposing sides of the base member. The mounting apparatus also includes a conductive element layer including a plurality of arranged conductive elements. The conductive element layer is positioned in the cavity such that the plurality of arranged conductive elements are in electrical contact with the first set of contact elements of the base member and also in electrical contact with the plurality of pins of the structure when received in the cavity.

In various embodiments of the apparatus, the mounting apparatus may include alignment structure such as described above, the conductive element layer may be a conductive elastomer layer, and the second set of contact elements of the base member may include solder spheres.

An adapter apparatus according to the present invention for receiving a packaged device, e.g., a land grid array, having a plurality of contact pads disposed on a surface thereof is also described. The adapter apparatus includes a base member including a first side and an opposing second side. The base member includes a plurality of solder spheres on the first side thereof electrically connected to a plurality of contact elements on the second side. The apparatus further includes a perimeter wall member having a length along an adapter axis between a first end of the wall member and a second end of the wall member. The first end of wall member is positioned adjacent the base member. A conductive element layer including a plurality of arranged conductive elements is positioned at the first end of the perimeter wall member orthogonal to the adapter axis. The perimeter wall member and the base member define a socket cavity to receive the packaged device with the plurality of contact pads thereof adjacent the conductive element layer. A cover member is positioned at the second end of the perimeter wall member to close the socket cavity. The cover member is movable to allow the packaged device to be removed from the socket cavity. A floating member is movable in the socket cavity and an actuator element is operable to provide a force on the floating member such that a corresponding force is distributed to the packaged device when received in the socket cavity such that the plurality of contact pads thereof are in electrical contact with the arranged conductive elements of the conductive element layer.

In various embodiments of the apparatus, the actuator element may be associated with the cover member, the actuator element may be a threaded element movable in a threaded insert of the cover member, and/or the threaded element may include a heat sink head portion with a threaded portion extending therefrom.

In other embodiments, the floating member may be a plate member having a surface configured as a function of a surface of the packaged device with the surface of the plate member positioned in direct contact with the surface of the packaged device when the packaged device is received in the socket cavity, the floating member may include a first surface configured as a function of a surface of the packaged device and a second opposing surface configured as a function of the actuator element with the second surface having an area substantially equal to a contact area of the actuator element, and/or the floating member may be of a pyramid-like configuration.

In yet other embodiments, the cover member includes a hinged member and a closure structure operable to latch the hinged member in a desired position relative to the perimeter wall member, the apparatus may include an alignment structure positioned in the socket cavity to align the contact pads of the packaged device with the plurality of solder spheres of the base member, and/or the conductive element layer may be a conductive elastomer layer.

DETAILED DESCRIPTION OF THE EMBODIMENTS

Generally, packaged device adapter assemblies for use with packaged devices, e.g., high density devices, shall be described herein. Generally, a first illustrative packaged device adapter assembly 10 according to the present invention shall be described with reference to illustrative FIGS. 1A and 1B. Various other illustrative embodiments of packaged device adapter assemblies according to the present invention including features which may be included in combination with features or structure of the other assemblies as described herein shall be described with reference to FIGS. 2–7. One skilled in the art will recognize from the description herein, that the various illustrative embodiments described include some features or elements included in other illustrative embodiments and/or exclude other features. However, a packaged device adapter assembly according to the present invention may include any combination of elements selected from one or more of the various embodiments as described herein with reference to FIGS. 1–8. For example, as will be readily apparent from the description below, an adhesive retaining surface described with reference to FIGS. 1A and 1B may be used with the alignment structure described with reference to FIGS. 2A and 2B. Further, for example, the cover member 460 described with reference to FIG. 5 may be used with one or more of the various adapter assembly embodiments described with reference to FIGS. 1A–1B, 2A–2B, 3 or 4. Further, for example, the adapter described with reference to FIG. 8 may also include alignment structures as described with reference to any of the other embodiments.

Figure 1A:
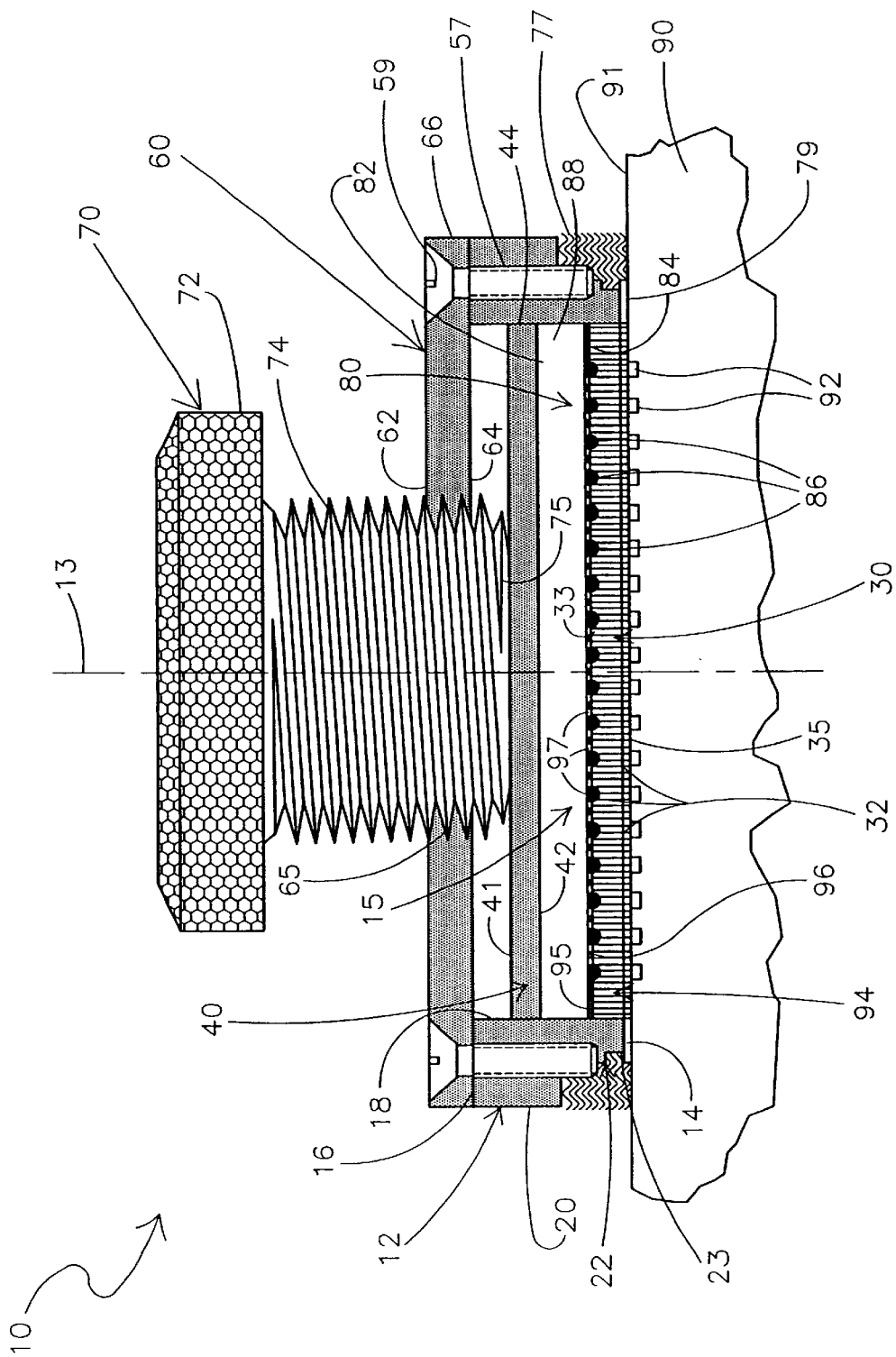
FIG. 1A is a cross-section side view of a packaged device adapter assembly according to the present invention mounted on a target board.
Figure 1B:
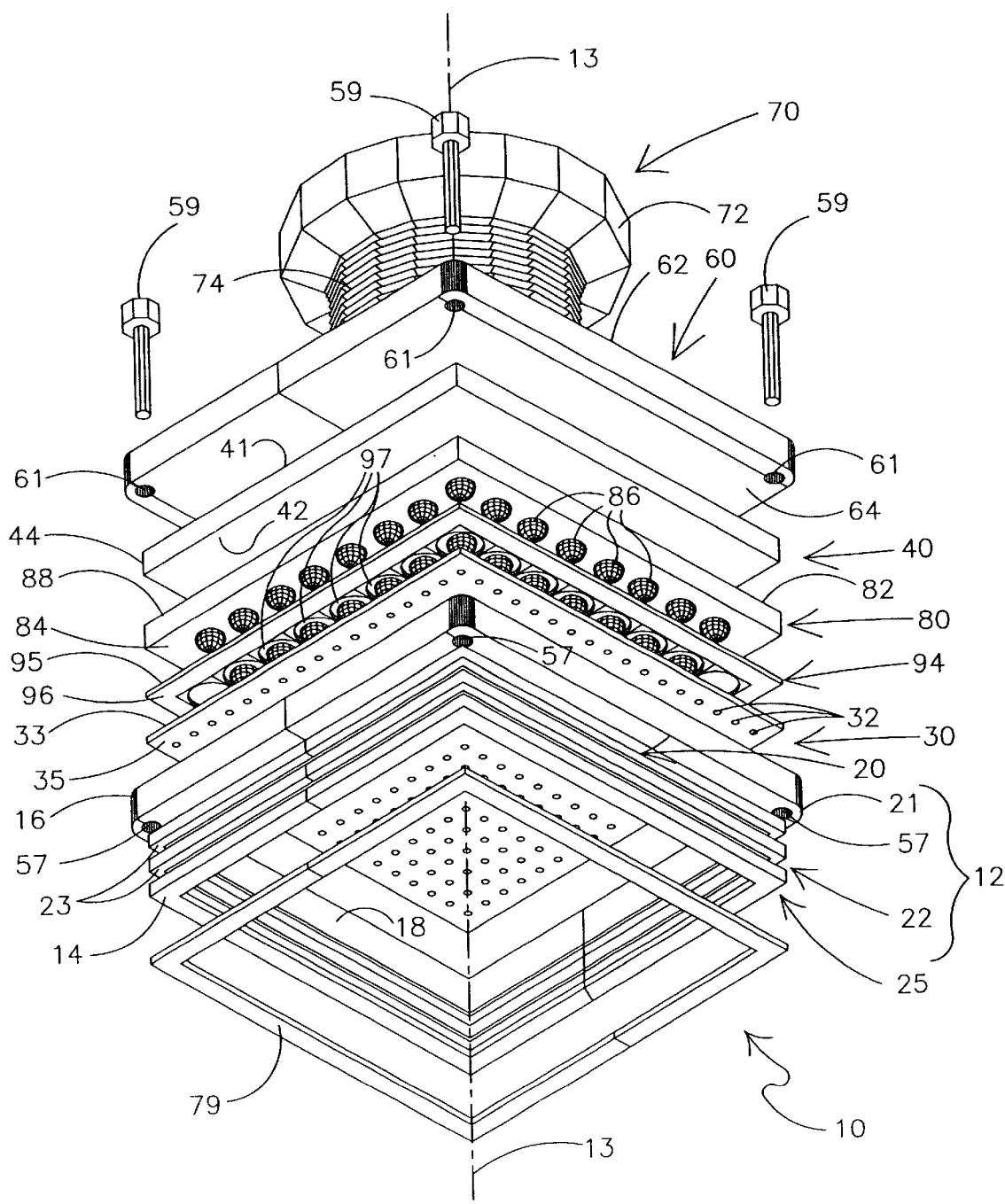
FIG. 1B is a bottom exploded perspective view of the packaged device adapter assembly of FIG. 1A.

FIGS. 1A and 1B show a cross-section side view and a bottom exploded perspective view, respectively, of an illustrative packaged device adapter assembly 10 for use with a packaged device 80 according to the present invention. Generally, the packaged device adapter assembly 10 is for mounting on a target board 90. The packaged device adapter assembly 10 includes a perimeter wall member 12 having a length along an adapter axis 13. Generally, the length of the perimeter wall member 12 extends between a first end 14 of the perimeter wall member 12 and a second end 16 of the perimeter wall member 12 and includes an inner surface 18 facing towards the adapter axis 13 and an opposing outer surface 20 facing away from the adapter axis 13.

The packaged device adapter assembly 10 further includes a conductive element layer 30 including a plurality of arranged conductive elements 32 therein, e.g., a conductive elastomer layer. The perimeter wall member 12 and the conductive element layer 30 including the plurality of arranged conductive elements 32 generally define a socket cavity 15 sized for receiving a packaged device 80 therein.

Generally, the packaged device 80 includes an upper surface 82 and a lower surface 84 in addition to an edge surface 88 extending therebetween at the perimeter of the packaged device 80. A plurality of contact elements 86 are disposed on the lower surface 84. Preferably, the contact elements 86 are distributed in an array along x and y axes orthogonal to the adapter axis 13. However, any arrangement of contact elements 86 may be accommodated according to the present invention.

Figure 8:
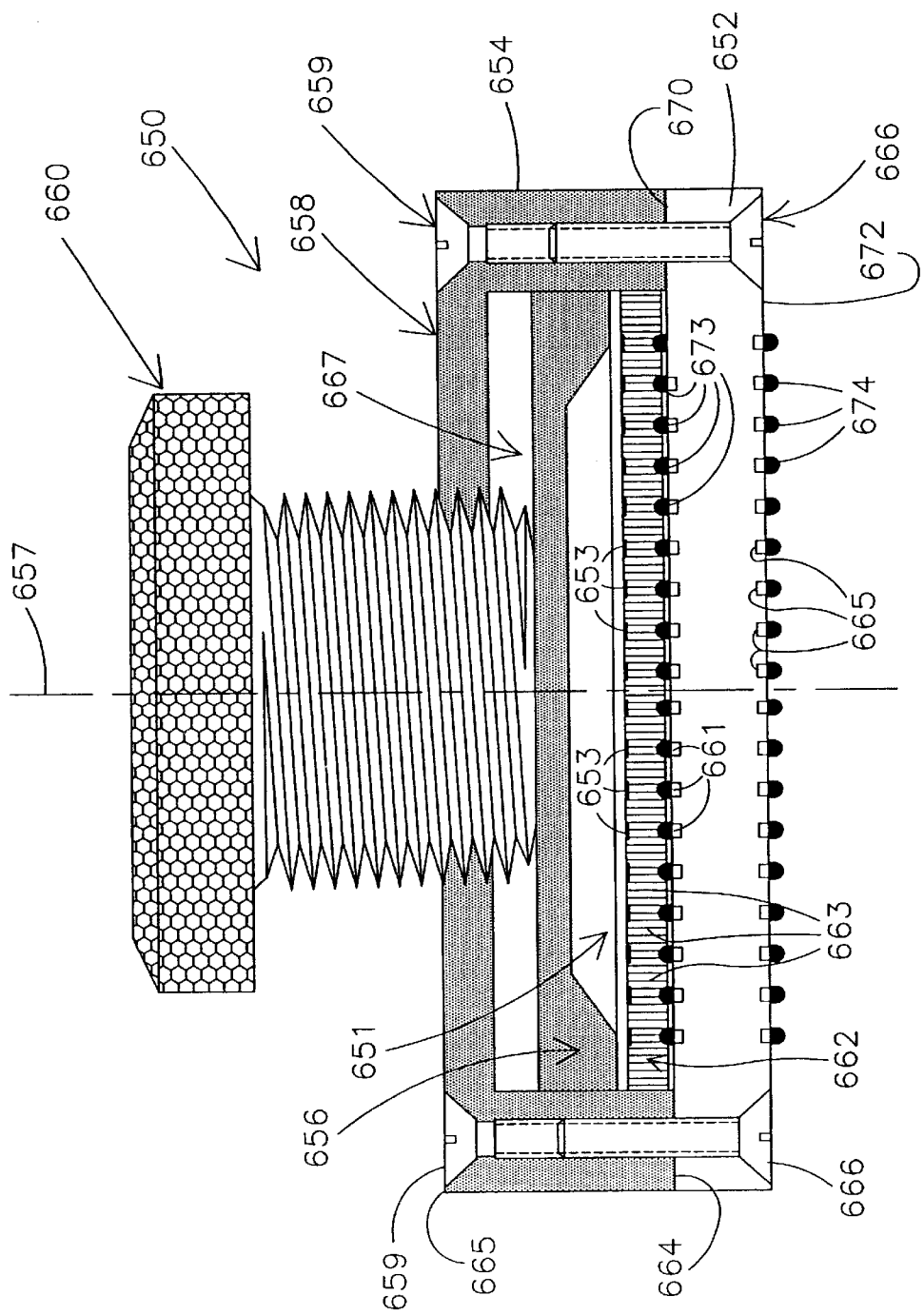
FIG. 8 shows a packaged device adapter assembly similar to that shown in FIG. 6 for use with packaged devices such as land grid array packages.

The packaged device 80 may be any packaged device having a plurality of contact elements 86 disposed on a surface thereof. Preferably, the packaged device is a device having a high density of contact terminals, e.g., solder spheres, bumps, contact pads, leads, etc., disposed on a surface thereof. For example, the high density packaged device may be a ball grid array package as shown in FIG. 1A and in the various other illustrative embodiments shown in the other figures described herein. However, the packaged device 80 may also be, for example, a chip scale package, a flip chip package, a flat package, a quad flat package, a small outline package, a micro ball grid array package, a land grid array package, or any other package having contact elements disposed on a surface thereof. Although the present invention is described herein with reference to a ball grid array package as illustrated in the figures, the present invention is in no manner limited to use of the illustrative adapter apparatus embodiments described herein with only ball grid array packages. Rather, the adapter assemblies and adapter concepts described herein may be used with any packaged device having contact elements disposed on a surface thereof. The adapter of FIG. 8 is particularly advantageous for use with land grid array packages.

Figure 5:
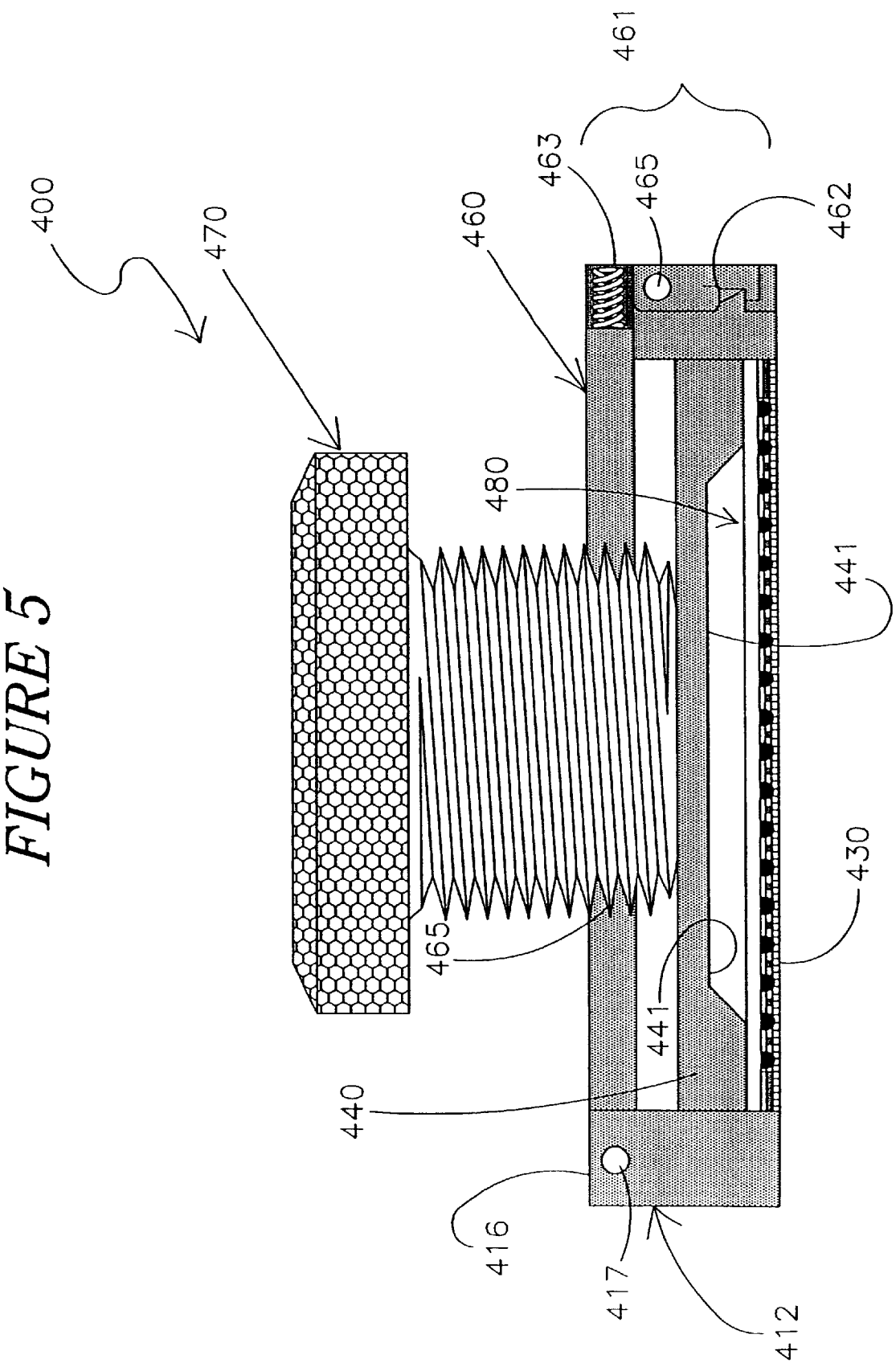
FIG. 5 is yet another alternate embodiment of a packaged device adapter assembly including a particular cover structure according to the present invention.

Further, the packaged device adapter assembly 10 includes a cover member 60 positioned at the second end 16 of the perimeter wall member 12 to close the socket cavity 15. The cover member 60 is generally movable, e.g., removable via fastening devices 59 as shown in FIG. 1A, moveable about a hinge axis 417 as shown in FIG. 5, etc. This allows the packaged device 80 to be removed from the socket cavity 15 and another packaged device placed therein. The packaged device adapter assembly 10 is generally used to provide electrical contact between the contact elements 86 of the packaged device 80 and contact pads 92 of the target board 90 via the arranged conductive elements 32 of conductive element layer 30, when the packaged device 80 is positioned in the socket cavity 15.

Figure 2A:
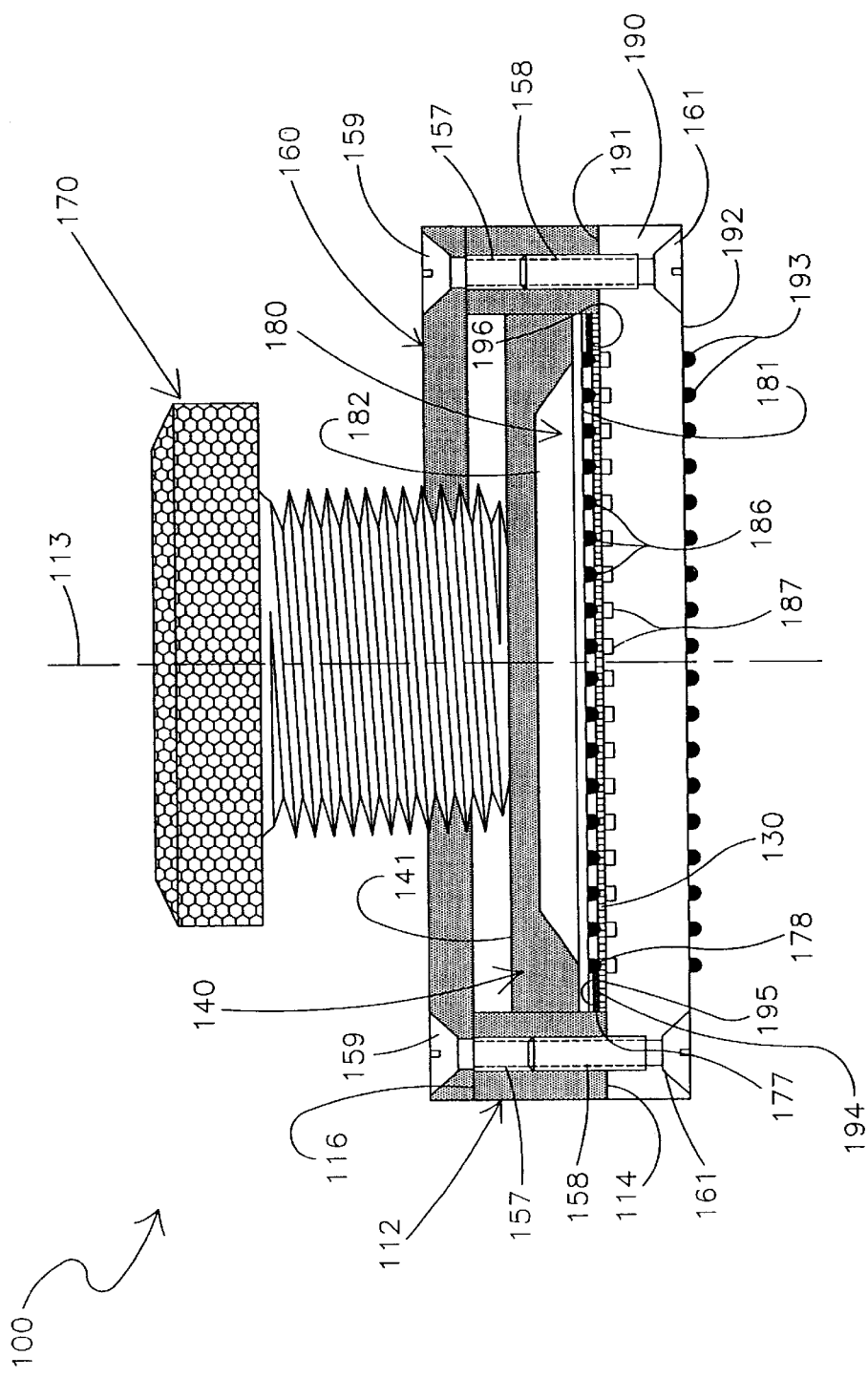
FIG. 2A is a cross-section side view of an alternate packaged device adapter assembly according to the present invention mounted on a target board.

The packaged device adapter assembly 10 further includes a floating member 40 as shown in FIGS. 1A and 1B. The floating member 40 is used in combination with an actuator element 70 to provide a distributed force on the packaged device 80 when received in the socket cavity 15 such that the contact elements 86 disposed on the lower surface 84 of the packaged device 80 are in effective electrical contact with the arranged conductive elements 32 of the conductive element layer 30. The floating member 40 preferably includes an upper surface 41 that is generally planer and orthogonal to the adapter axis 13 when the floating member 40 is positioned in the socket cavity 15. Further, the floating member 40 preferably includes a lower surface 42 that is configured as a function of the upper surface 82 of the packaged device 80. For example, as shown in FIG. 1A, lower surface 42 of the floating member 40 is generally planer and in direct contact with the planar upper surface 82 of a packaged device 80. However, as shown in FIG. 2A, the lower surface 142 of the floating member 140 is configured according to the upper surface 182 of the packaged device 180 and is not planer. However, in both cases, the lower surface 42, 142 of the floating member 40, 140 is in direct contact with the upper surface 82, 182 of the packaged device 80, 180. Further, as shown in FIG. 1A, the floating member 40 preferably includes an edge surface 44 extending between the upper surface 41 and the lower surface 42 at the perimeter of the floating member 40. The edge surface 44 lies adjacent, and may even be in contact with, the perimeter member wall 12 and is moveable relative thereto within the socket cavity 15. In one preferred embodiment as described with reference to FIGS. 10A–10D below, the floating member has a pyramid type configuration.

The actuator element 70 may be any actuator element operable to apply a force on the upper surface 41 of the floating member 40. As a force is applied by the actuator element 70 to the upper surface 41 of the floating member 40, the force is distributed generally equally along the upper surface 82 of the packaged device 80. As such, an equivalent force is provided at each contact element 86, e.g., solder ball, for effective contact between each contact element 86 and one or more conductive elements 32, e.g., conductive strands of a conductive elastomer layer. Such a distributed force across the entire packaged device 80 reduces the potential application of excessive force on one part of the packaged device 80 versus another part thereof, e.g., the center versus the perimeter.

Preferably, the actuator element 70 is an element associated with the cover member 60. For example, the actuator element may be a spring element, a leaf spring, or any other flexible element capable of applying a force to the floating member 40 via the association with the cover member 70. Further, although not preferred, the cover member 70 itself may be used to apply a force to the floating member 40 such as by tightening the cover member directly down on the floating member 40 by fastening elements, e.g., screws 59.

Preferably, the actuator element 70 is a threaded element that includes a head portion 72 with a threaded portion 74 extending therefrom. Further, preferably, the cover member 60 includes a threaded insert 65 positionable along the axis 13 of the adapter assembly 10 for mating with the threaded portion 74 of the actuator element 70. The threaded portion 74 terminates in a generally planer surface 75. With the packaged device 80 in the socket cavity 15, the planer surface 75 is placed in direct contact with the upper surface 41 of the floating member 40 by turning the head portion 72 of the actuator element 70. As such, the actuator element 70 is adjustable to provide an effective force to the upper surface 41 of floating member 40 such that the distributed force is applied for effective electrical coupling of the contact elements 86 to the arranged conductive elements 32 of conductive element layer 30. With use of the actuator element 70 and the floating member 40, a suitable distributed force on the packaged device 80 can be achieved. The minimized load applied to the packaged device 80 and thus to the conductive elements 32 of the conductive element layer 30 allows for operation of the adapter assembly 10 over many insertion cycles as the conductive element layer 30 is not unnecessarily damaged by the force applied to the packaged device 80 in order to achieve contact between all of the contact elements 86 and the arranged conductive elements 32.

Preferably, the floating member 40 is formed of a heat conductive material, e.g., aluminum, to provide heat sinking capability. Further, actuator element 70 and the perimeter wall member 12 and cover 60 are formed of such heat sinking material. In such a manner, the elements that form the socket cavity 15 which provide electrical coupling of the packaged device 80 to a target board 90 also function to dissipate heat away from the packaged device 80 when the packaged device 80 is operable. This is particularly important for high density packaged devices such as ball grid array packages, chip scale packages, flip-chip packages, etc., in that the packaged device 80 tends to operate with greater heat output.

As can be readily seen from FIG. 1A, the floating member 40 is sized and configured such that edge 44 thereof is in moveable contact with inner surface 18 of the perimeter wall member 12 which allows heat conduction therethrough and away from the packaged device 80. Likewise, the contact between the actuator element 70, such as a screw formed of aluminum, provides for heat conduction from the threaded portion 74 (which is in direct contact with the floating member 40) to the head portion 72 of the actuator element 70. The head portion 72 is sized and configured to provide a large surface area for heat dissipation therefrom.

The perimeter wall member 12 includes an inner surface 18 facing inward towards the adapter axis 13 and an outer surface 20 facing in an opposing direction generally away from the adapter axis 13. The outer surface 20 includes an adhesive retaining surface 22 adjacent the first end 14 of the perimeter wall member 12. Generally, any adhesive retaining surface 22 which provides for mounting the adapter assembly 10 to the target board 90 without the use of any particular adaptation of the target board, e.g., the drilling of holes therein, the attachment of structure thereto, etc., may be used according to the present invention.

Preferably, the adhesive retaining surface 22 includes a plurality of grooves or channels 23 for receiving adhesive material 77, e.g., an epoxy, and is retained therein and which is also positioned adjacent to target board 90 such that the adapter assembly 10 is affixed to the target board 90 when the adhesive material is set or cured. The channels may be configured and sized in various manners, e.g., vertical channels parallel to the adapter axis 13, horizontal channels, angled channels, curved channels, etc. However, any adhesive retaining surface 22 may be used according to the present invention. For example, the adhesive retaining surface 22 may be an abrasive surface capable of retaining an adhesive material thereon, may be a ribbed surface, or may be any other surface for retaining an adhesive material thereon.

The adhesive material 77 may be any adhesive material that is suitable for being received by the adhesive retaining surface 22, such as in grooves 23, and which is suitable for attaching or mounting the adapter assembly 10 to the target board 90 by contact with the adhesive retaining surface 22 and the target board surface 91. For example, the adhesive material 77 may be an epoxy, may be a tape product, or may be any other adhesive material suitable for performing such retention or fixation.

As shown in FIG. 1B, the perimeter wall member 12 generally includes a wall member base 21 and an adhesive retaining portion 25. As such, this wall member 12 may be formed of two separate pieces or it may be formed as a single piece element. It will be recognized that other elements formed herein made also be made of a single or multiple layer structure. For example, the floating member 40 may be formed of one or more layers.

The adapter assembly 10, as more clearly shown in FIG. 1B, is formed in a substantially square configuration. However, one skilled in the art will recognize that the elements used in forming the packaged device adapter assembly 10 may include elements for forming an adapter assembly configured as a rectangle, a circle, or any other configuration sized to accommodate a packaged device received in a socket cavity therein. As such, one skilled in the art will recognize that the present invention is not limited to any particular shape of adapter assembly but is limited only as described in the appended claims.

The perimeter wall member 12 further has affixed thereto an additional adhesive material 79 to temporarily position an adapter assembly 10 on a target board 90 as will be described further below prior to affixing the adapter assembly 10 to the target board 90 using the adhesive material 77 on the adhesive retaining surface 22 and the target board 90. For example, the additional adhesive material 79 may include double-sided tape or any other like adhesive.

The cover member 60 of the packaged device adapter assembly 10 may be configured in various manners. The cover member 60 is used to close the socket cavity 15 and includes various other elements associated therewith for facilitating other functionality. For example, as previously described herein, cover member 60 is integrated with a threaded insert 65 for receiving the threaded portion 74 of the actuator element 70 used in applying a direct force to floating member 40. Further, cover member 60 as shown in FIG. 1A includes openings 61 for receiving corresponding fastening elements 59, e.g., screws, to affix cover member 60 to the perimeter wall member 12. In such an embodiment, the perimeter wall member 12 includes inserts 57 for retaining the fastening elements 59 therein. For example, as shown in FIG. 1A, inserts 57 may be threaded inserts for retaining threaded screw portions of screws 59 to attach cover member 60 to the perimeter wall member 12.

However, the cover member 60 may also be configured as a latchable hinge cover 460 as shown in FIG. 5, e.g., a ZIF type or clam-type lid. FIG. 5 is a cross-section side view of a packaged device adapter assembly 400 which includes a perimeter wall member 412 and a conductive element layer 430 to form a socket cavity for receiving a packaged device 480 in a manner similar to that as shown in FIG. 1A. However, instead of a screw down cover member 60 as shown in FIG. 1A, a latchable hinge cover member 460 is shown in FIG. 5. The latchable hinge cover member 460 is attached at the upper end 416 of the perimeter wall member 412 by hinge mechanism 417. The latchable hinge cover 460 further includes a latchable closure mechanism 461 to provide for latching of the cover member 460 to the perimeter wall member 412. For example, as shown in FIG. 5, the latchable closure mechanism 461 includes a spring 463 coupled to a latch member 462 which is coupled at hinge 465 for operation with spring 463. One skilled in the art will recognize that this is just one embodiment of a latchable closure mechanism 461 useable in accordance with the present invention and that any closure mechanism for a cover member that is not entirely removed to allow removal of a packaged device from socket cavity 15 may be used according to the present invention.

Also as shown in FIG. 5, the hinged latchable cover 460 includes a threaded insert 465 for receiving the heat sink screw actuator 470. Further, also as shown in FIG. 5, the lower surface 441 of floating member 440 used therein is sized in accordance with the packaged device 480 such that the distributed force from the actuator element 470 is effectively provided to the packaged device 480.

Further with reference to FIGS. 1A and 1B, the conductive element layer 30 includes an upper surface 33 and a lower surface 35. The arranged conductive elements 32 extend from the upper surface 33 to the lower surface 35 through insulative material to provide isolated conductive paths therethrough. The upper surface 33 is configured to allow contact between the contact elements 86 of the packaged device 80 and the conductive elements 32 arranged therein and the lower surface 35 is configured to allow contact between the conductive elements 32 and the contact pads 92 of the target board 90.

The conductive element layer 30 including the arranged conductive elements 32 is preferably a conductive elastomer layer. For example, the conductive elastomer layer may be formed of a z-axis elastomer material or a slanted axis conductive elastomer material. For example, such material may be that as described in U.S. Pat. No. 4,923,739 to Jin et al., issued May 8, 1990 and entitled "Composite Electrical Interconnection Medium Comprising a Conductive Network, And Article, Assembly, and Method;" that as described in U.S. Pat. No. 4,754,546 to Lee et al., issued Jul. 5, 1988 and entitled "Electrical Connector for Surface Mounting and Method of Making Thereof;" that as described in U.S. Pat. No. 4,729,166 to Lee et al., issued Mar. 8 1988 and entitled "Method of Fabricating Electrical Connector for Surface Mounting,"that as described in U.S. Pat. No. 4,668,957 to Spohr, issued May 26, 1987 and entitled "Amorphous Glass Matrix Containing Aligned Microscopically Thin Metal Conductors;" or may be any other conductive elastomer material such as that available from Shin-Etsu Polymer America Inc. (Union City, Calif.) under the trade designation GB-Matrix.

Although the conductive element layer 30 is preferably a conductive elastomer material having conductive elements or material arranged therein, various other layers which include arranged conductive elements 32 therein may also be used according to the present invention. For example, the arranged conductive elements 32 may include formed conductive element structures, stamped conductive elements structures, or any other conductive material for connecting contact elements 86 to contact pads 92 on target board 90, e.g., pins, springs, pogo pins, or fizz buttons.

As shown in FIG. 1A, the sizing of various elements therein are used to align the contact elements 86, e.g., solder spheres, of packaged device 80 with the contact pads 92 of the target board 90. For example, the inner surface 18 of perimeter wall member 12 may be configured to set edge 88 of the packaged device 80 in contact therewith to assist in alignment of the contact elements 86 with the contact pads 92. However, preferably, the adapter assemblies described herein include additional alignment structure to precisely position the packaged device 80 over the contact pads 92 of target board 90 in addition to the various alignment functionality already provided by the perimeter wall member 12. The alignment structure, such as a precise spacer structure, allows for easy and reliable connection of the contact elements 86 of packaged device 80 to the contact pads 92 via the conductive element layer 30 including the arranged conductive elements 32. Various alignment structures shall be described with reference to FIGS. 1A–1B, 2A–2B, 3, and 4.

As shown in FIG. 1A with regard to the packaged device adapter assembly 10, the alignment structure is provided by an alignment plate 94 positioned orthogonal to the adapter axis 13 between the upper surface 33 of the conductive element layer 30 and the lower surface 84 of the packaged device 80 on which the plurality of contact elements 86 are disposed. Preferably, the alignment plate 94 includes a planar upper surface 95 adjacent to lower surface 84 of the packaged device 80 and a planar lower surface 96 adjacent to upper surface 33 of conductive element layer 30. The alignment plate 94 may or may not be in direct contact with adjacent surfaces.

The alignment plate 94 is a planer plate structure having a plurality of openings 97 defined therein. Each opening 97 corresponds to one of the contact elements 86 disposed on the lower surface 84 of the packaged device 80. For example, when the packaged device 80 is a ball grid array having a plurality of solder spheres disposed on a surface thereof, each opening 97 as shown in FIG. 1A corresponds to one of the solder spheres. In this manner, when the packaged device 80 is positioned in the socket cavity 15, the contact elements 86 are precisely positioned on the target board 90 as the openings 97 defined in the alignment plate 94 are sized and configured to directly align the contact elements 86 with the contact pads 92.

Figure 2B:
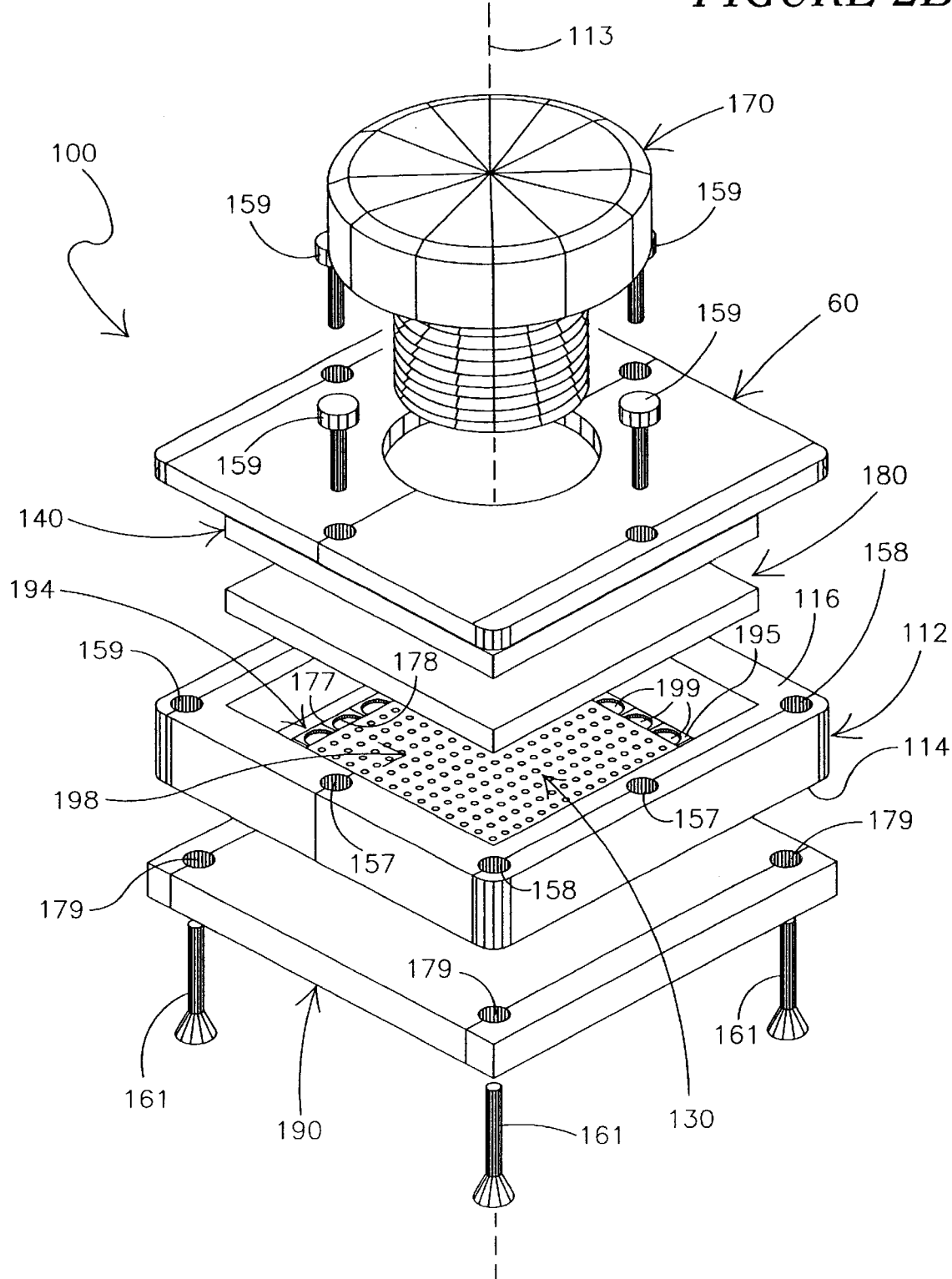
FIG. 2B is a top exploded perspective view of the packaged device adapter assembly shown in FIG. 2A.

In an alternate embodiment, adapter assembly 100 shown in FIG. 2A includes perimeter wall member 112 and conductive element layer 130, e.g., a conductive elastomer layer, which define a socket cavity wherein packaged device 180 is received in a manner like that as described with reference to FIG. 1A. The alignment structure for providing precise alignment of contact elements 186 with contact pad; 187 of target board 190 is provided by alignment plate 194. Alignment plate 194 includes an upper surface 195 adjacent the lower surface 181 of packaged device 180 and a lower surface 196 adjacent to the conductive element layer 130. As shown in FIGS. 2A and 2B, the alignment plate 194L includes a single opening 198 defined therein for precisely positioning contact elements 186 of the packaged device 180 relative to the contact pads 187 of target board 190. The alignment plate 194 includes an outer surface 177 about the outer perimeter of the alignment plate 194 which is adjacent, and preferably in contact with the perimeter wall 112, and includes an inner surface 178 about the inner perimeter of the alignment plate 194 defining opening 198. The inner surface 178 of the alignment plate 194 includes arc portions 199 extending about the inner perimeter. The arc portions 199 correspond to certain perimeter contact elements 186 (e.g., solder spheres of a ball grid array package). With use of alignment plate 194, by aligning the outer perimeter solder balls of contact elements 186 as shown in FIG. 2A, the remainder of the solder balls are aligned with the contact pads 187 of the target board 190.

Figure 3:
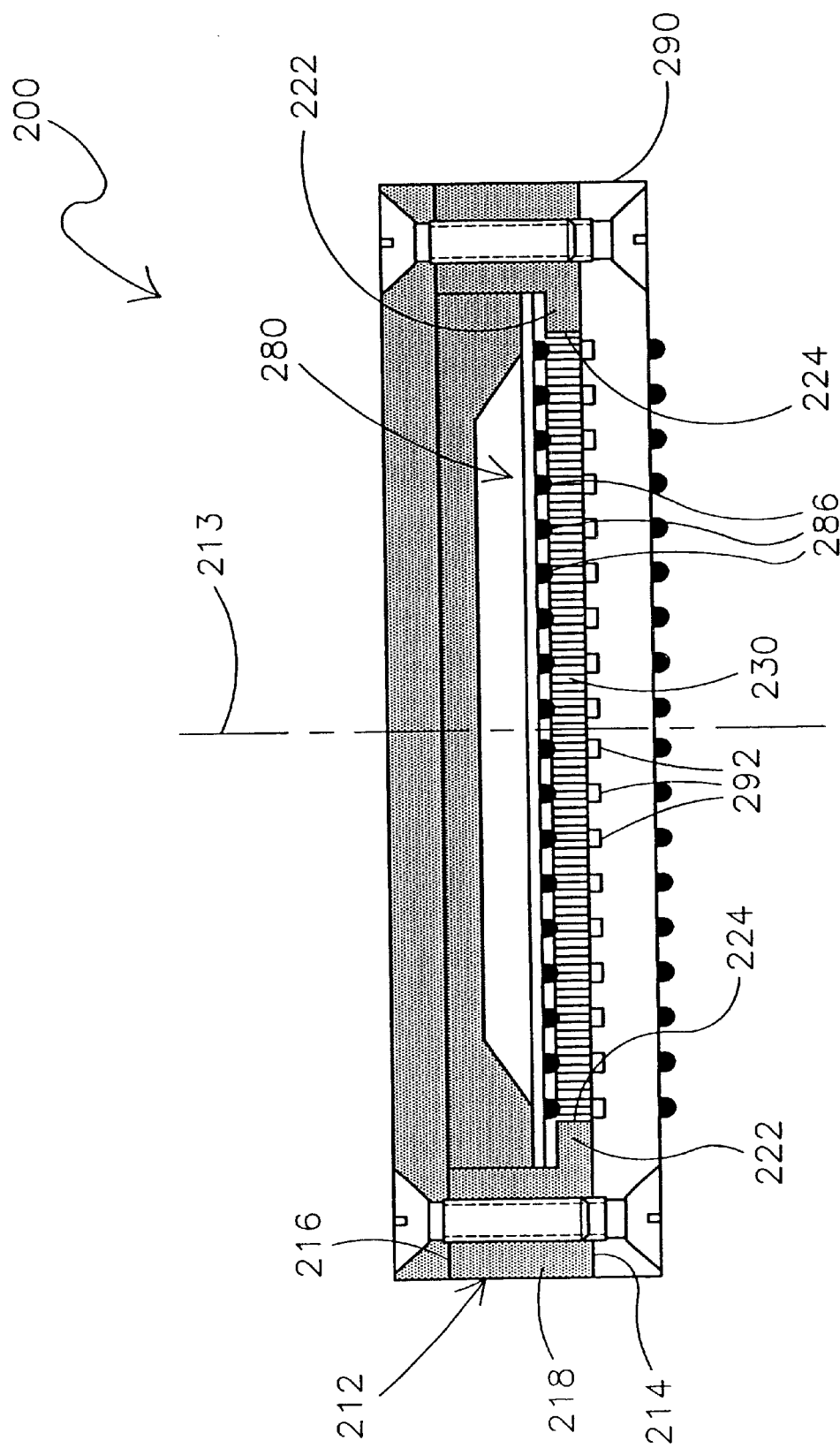
FIG. 3 is another alternate embodiment of a packaged device adapter assembly showing a particular alignment structure according to the present invention.
Figure 4:
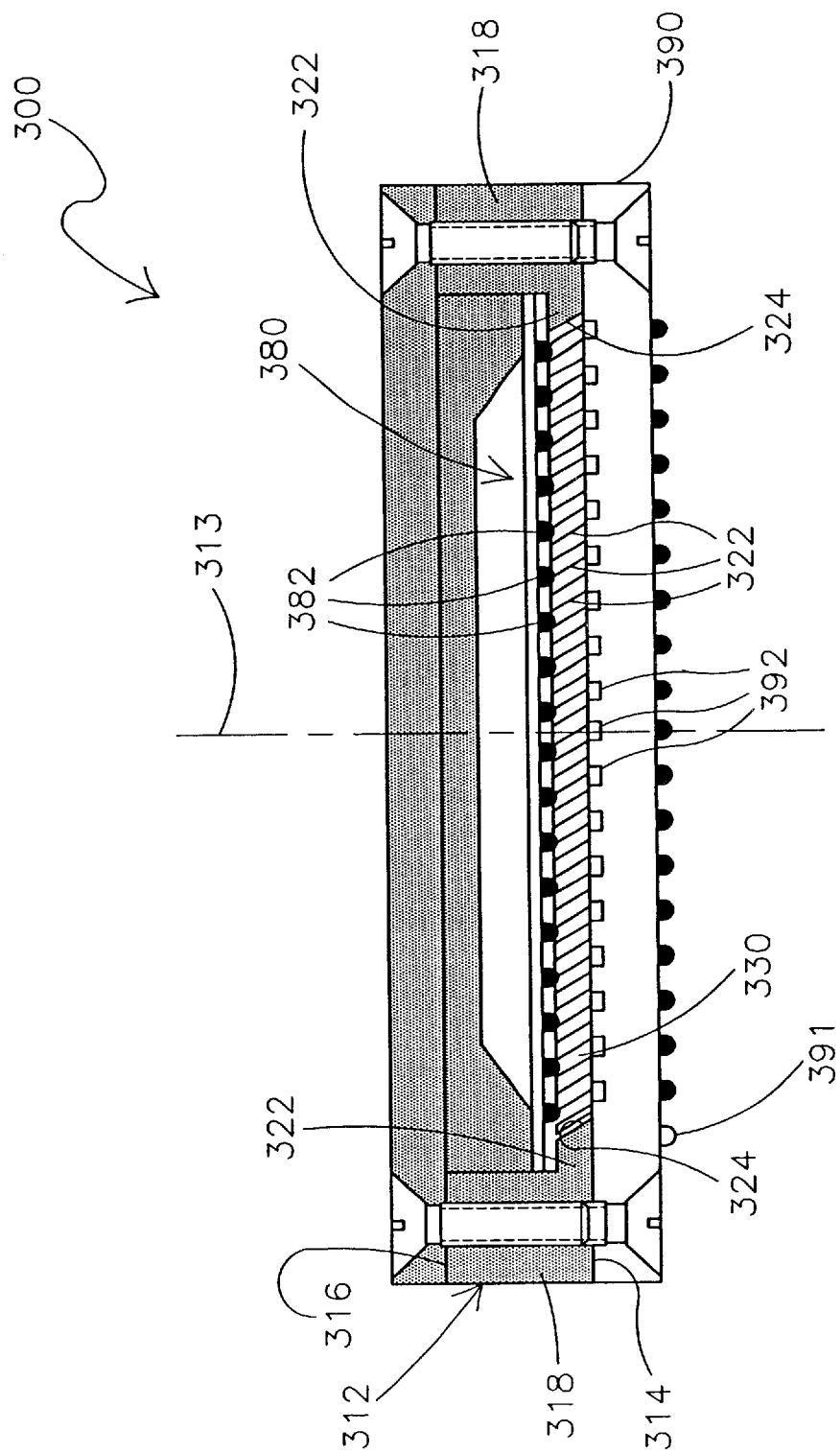
FIG. 4 is yet another alternate embodiment of a packaged device adapter assembly showing another alternate alignment structure according to the present invention.

Alignment structures for precise positioning of contact elements of a packaged device may also be provided by extensions from the perimeter wall member of the adapter assembly as shown in the adapter assembly embodiments of FIGS. 3 and 4. For example, as shown in FIG. 3, adapter assembly 200 includes a perimeter wall member 212 having a length along adapter axis 213 between a first end 214 and second end 216 of the perimeter wall member 212. Generally, the perimeter wall member 212 forms a socket cavity with a conductive element layer 230 for receiving a packaged device 280 therein. The adapter assembly 200 is substantially like the assembly shown in FIG. 2 except without the actuator element.

The perimeter wall member 212 includes a first wall portion 218 which lies generally parallel to the adapter axis 213. A second wall portion 222 extends adjacent the lower end 214 of the perimeter wall member 212 inward toward adapter axis 213. Preferably, the second wall portion 222 extends inward generally orthogonal to the adapter axis 213. This second wall portion 222 forms a lip for providing alignment of the contact elements 286 of packaged device 280 with contact pads 292 of target board 290. The second wall portion 222 terminates at end surface 224 which is adjacent the conductive element layer 230, e.g., a conductive elastomer layer, and generally parallel to the adapter axis 213 to accommodate a conductive elastomer layer that has z-axis conductive elements therein. In such a manner, the solder balls 286 of packaged device 280 are aligned to contact pads 292 of target board 290 through a desired number of z-axis conductive elements embedded in conductive elastomer layer 230.

The alignment structure shown in adapter assembly 300 of FIG. 4 is provided in a manner similar to that shown and described with reference to FIG. 3. However, the extension of the perimeter wall member 312 accommodates the use of a conductive elastomer layer 330 having slanted conductive elements 322 embedded therein. As shown in FIG. 4, adapter assembly 300 includes perimeter wall member 312 having a length along adapter axis 313 between a first end 314 and a second end 316. The perimeter wall member 312 and a conductive elastomer layer 330 form a socket cavity for receiving a packaged device 380 therein. Generally, the perimeter wall member 312 includes a first wall portion 318 which lies generally parallel to adapter axis 313. Further, the perimeter wall member 312 includes a second wall portion 322 extending generally orthogonal to adapter axis 313 and first wall portion 318 and which extends therefrom towards the axis 313. The second wall portion 322 terminates at a surface end 324 that is adjacent the conductive elastomer layer 330 and at an angle relative to the adapter axis 313. The angle is determined at least in part by the angle of the slanted conductive elements embedded in the conductive elastomer layer 330. In such a manner, the contact elements 382 disposed on a surface of packaged device 380 can be aligned with contact pads 392 of target board 390 through a desired number of angled conductive elements 322 embedded in conductive elastomer 330. As shown in this particular embodiment, with the adapter assembly 300 mounted to target board 390, dummy spheres 391 may be used to balance the target board 390 relative to the adapter assembly 300. In other words, the number of solder spheres on the lower surface of target board 390 are made symmetrical about adapter axis 313.

The adapter assemblies as described herein may be mounted relative to various target boards as illustrated generally in FIG. 1A by target board 90. The target board 90 may be any substrate including contact pads arranged thereon for electrical connection with the adapter assembly 10. For example, the target board may be a printed circuit board including various other components mounted thereon or may be a surface mountable substrate as shown and described with reference to FIG. 2A.

As shown in FIG. 2A, the target board 190 includes an upper surface 191 having a plurality of contact pads 187 disposed thereon for electrical contact with conductive elastomer layer 130. A plurality of surface mountable solder spheres 193 are disposed on lower surface 192, e.g., arranged in an array like solder balls 186. The contact pads 187 are electrically coupled to solder spheres 193 through use of conductive traces or any other conductive elements generally used to provide electrical contact between conductive elements disposed on opposing surfaces of a substrate. Further, for example, the target board 190 may be formed of FR4 material and printed with conductive traces as performed using conventional printed circuit board fabrication techniques.

As shown in FIG. 2A, the adapter assembly 100 is mounted to target board 190 in a manner unlike that shown in FIG. 1A. As shown in FIG. 2A, target board 190 includes a plurality of openings 179 defined therein for receiving fastening devices 161, e.g., screws. The perimeter wall member 112 of adapter assembly 100 includes inserts 158, e.g., threaded inserts, for mating with fastening devices 161. As such, the target board 190 is mounted adjacent the first end 114 of perimeter wall member 112 by insertion of fastening elements 161 through openings 179 defined in target board 190 and coupled with threaded inserts 158 within perimeter wall member 112.

Figure 6:
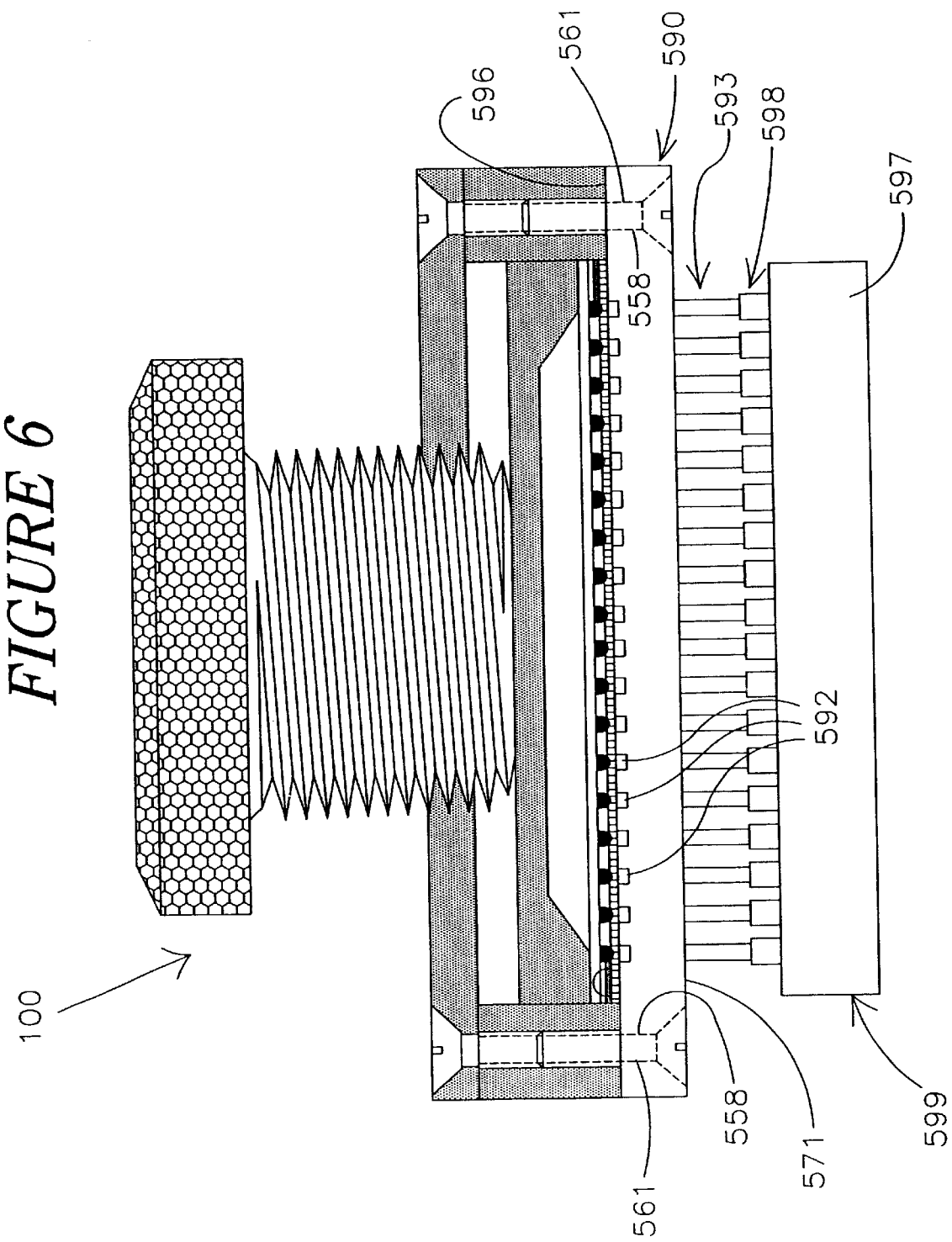
FIG. 6 shows a packaged device adapter assembly similar to that shown in FIG. 2A and further including a particular embodiment of a target board useable with the adapter assembly according to the present invention.
Figure 7:
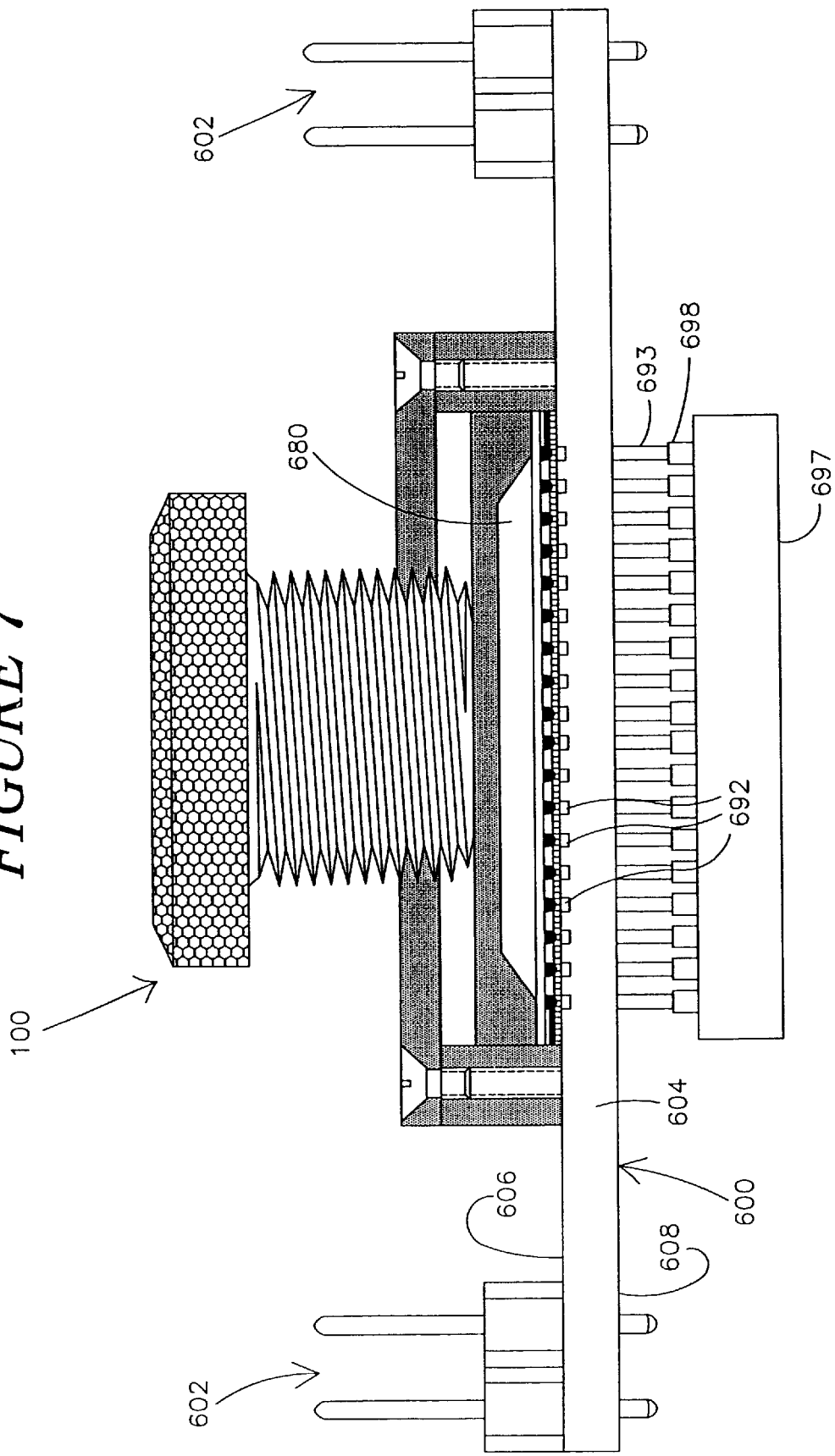
FIG. 7 also shows a packaged device adapter assembly similar to that shown in FIG. 2A in addition to yet another alternate embodiment of a target board useable with the adapter assembly according to the present invention.

The target board upon which the adapter assemblies are mounted may further include other types of target boards such as that shown in FIGS. 6 and 7. The adapter assemblies shown in FIGS. 6 and 7 are substantially identical to the adapter assembly 100 as shown in FIG. 2A except that the alignment plate used in FIGS. 6 and 7 is an alignment plate like that shown in FIG. 1A.

As shown in FIG. 6, the adapter assembly 100 is mounted relative to target board 590. Target board 590 includes openings 558 defined therein for attachment of the target board 590 to the adapter assembly 100 using fastening devices 561 in a manner similar to that shown in FIGS. 2A–2B. The target board 590 further includes male pins 593 extending beyond the lower surface 571 and electrically connected to the contact pads 592 disposed on the upper surface 596 thereof As such, the male pin elements 593 may be used with female socket elements 598 extending from a substrate body 597 of an additional adapter apparatus 599.

As shown in FIG. 7, the adapter assembly 100 is mounted relative to target board 600. Target board 600 includes male pin elements 693 electrically connected to contact elements 692 disposed on upper surface 606 of target board 600. Male pin elements 693 extend beyond lower surface 608 of the target board 600 for mating with female socket elements 698 of another adapter apparatus or device 697. Further, the target board 600 includes conductive traces from contact pads 692 to test probes 602 for use in providing testing of packaged device 680 or a circuit board having other functionality (not shown) mounted relative to the adapter assembly, e.g., via the adapter apparatus 697.

As such, and as described in FIGS. 6 and 7, the target board may include a male or female pin interface at the lower surface thereof, the target board may be surface mountable such as when solder balls are mounted at a lower surface thereof, test probes may be integrated with the target board, or any other target board may be mounted relative to the adapter assemblies as described herein.

The adapter assemblies described herein are preferably very small, e.g., 0.2inches larger than the actual packaged device mounted in the socket cavity thereof. Further, the elements of the adapter assembly are preferably formed of heat conductive material such that heat can be dissipated away from the packaged device mounted in the socket cavities thereof. By providing conductive elements that have a relatively short length along the axis of the adapter assembly to connect the contact elements of the packaged device to a target board, very high speed applications can be performed. The adapter assembly is generally very robust in that it does not lose connections very easily because of the distributed force applied on the packaged device mounted within the adapter assembly. Further, very high density packaged devices can be accommodated, particularly with use of a conductive elastomer layer, and yet further, unlimited number of insertion cycles may be accomplished with replacement of the conductive elastomer as needed.

A method of assembling the adapter assembly 10 shall be further described with reference to FIGS. 1A and 1B. Such techniques may be utilized with any of the other adapter assemblies described herein and it will be recognized that any number of various methods of assembly may be used and that the present invention is not limited to the method described herein. Preferably, adapter assembly 10 is assembled in the following manner. First, the alignment plate 94 is positioned on target board 90 with the openings defined in the alignment plate 94 aligned with the contact pads 92 of the An target board 90. The double-sided tape 79 is then positioned about the perimeter of the alignment plate 94. The alignment plate 94 is then removed for later use.

Thereafter, perimeter wall member 12 is positioned on the double-sided tape 79 to initially fasten at least a portion of the adapter assembly 10 to the target board 90. The conductive element layer 30, e.g., a conductive elastomer layer, is then positioned within the perimeter wall member 12 and adjacent the double-sided tape 79 to form cavity 15 in which the packaged device 80 may be placed. Alignment plate 94 is then positioned over conductive element layer 30 and thereafter packaged device 80 is positioned within socket cavity 15. Floating member 40 is then positioned within socket cavity 15 adjacent to upper surface 82 of packaged device 80 and cover member 60 is mechanically coupled to perimeter wall member 12 via suitable fastening elements 59. Thereafter, actuator element 70 is threaded into threaded insert 65 of cover member 60 and a force is applied via the actuator element 70 to the upper surface 41 of floating member 40 such that contact elements 86 of packaged device 80 are in effective contact with conductive elements 32 of the conductive element layer 30. In such a manner, precise alignment of the contact elements 86 with the contact pads 92 is accomplished. It will be recognized that adhesive material 77 may be used to mount the assembly 10 to the target board at any time after the perimeter wall member 12 is positioned on the additional adhesive material 79. Preferably, the adhesive material 77 is placed in contact with the adhesive retaining surface 22 and an area of the target board 90.

Another adapter assembly 650 for use with a packaged device, such as a land grid array package, is shown in FIG. 8. Generally, the packaged device adapter assembly 650 is preferably used with a land grid array package 651 having a plurality of contact pads 653 disposed on a mounting surface thereof.

As shown in FIG. 8, packaged device adapter assembly 650 includes a base member 652, e.g., a surface mountable target board, having a first side 670 and a second side 672 facing in an opposite direction relative to first side 670. A plurality of solder spheres 673 are disposed on first side 670 of base member 652. Generally, the plurality of solder spheres 673 correspond to the contact pads 653 of the packaged device 651 and are disposed on printed circuit board 652 for alignment with such contact pads 653.

Further, a plurality of contact elements 665 are disposed on the second side of base member 652. The contact elements 665 are electrically connected to solder spheres 673. For example, base member 652 is generally a printed circuit board having a plurality of contact pads 661 upon which solder spheres 673 are disposed. Such contact pads 661 are electrically connected to contact elements 665, e.g., contact pads, disposed on the second side of the printed circuit board 652. Solder spheres 674 may then be positioned on the contact pads 665 of the printed circuit board 652.

The adapter assembly 650 further includes a perimeter wall member 654 which lies generally parallel to an adapter axis 657 extending through the adapter assembly 650 generally orthogonal to base member 652. The perimeter wall member 654 has a length along the adapter axis 657 between a first end 664 and a second end 665. The packaged device adapter assembly 650 also includes a cover member 658 positioned at the second end 665 of the perimeter wall member 654 to close the socket cavity 667 defined by the base member 652 and the perimeter wall member 654. The socket cavity 667 is sized for receiving the packaged device 651 therein.

The packaged device adapter assembly 650 also includes a conductive element layer 662 including a plurality of arranged conductive elements 663 therein, e.g., a conductive elastomer layer with conductive strands therein. The conductive element layer 662 is positioned in the socket cavity 667 adjacent solder spheres 673. The conductive element layer 662 provides for a conductive path from the contact pads 653 of packaged device 651 to the solder spheres 673 disposed on the first side 670 of the base member 652.

The cover member 658 is mechanically attached to the perimeter wall member 654 by any suitable fastener system 659. Likewise, base member 652 is fastened to perimeter wall member 654 by any suitable fastener system 666. As shown in FIG. 8, the fastener systems 659 and 666 include threaded inserts and associated threaded screws. However, any suitable fastening and/or clamping systems or devices may be used.

The packaged device adapter assembly 650 further includes a floating member 656 used in combination with an actuator element 660 to provide a distributed force on the packaged device 651 when received in the socket cavity 667. The distributed force is such that the contact elements 653, e.g., land grid array pads, disposed on the mounting surface of the packaged device 651 are in effective electrical contact with the arranged conductive elements 663 of the conductive element layer 662.

The actuator element 660 is used to apply a force on the floating member 656 as the threaded portion of the actuator element 660 is turned within a threaded insert in cover member 658. As force is applied by the actuator element 660, the force is distributed generally equally along upper surface of the packaged device 651. One will recognize that the floating member 656 may include many different configurations including the pyramid-like configuration as shown and described with reference to FIG. 10. As the force is distributed generally equally, an equivalent force is provided at each contact pad 653 for effective contact between each contact pad 653 and one or more conductive elements 663, e.g., conductive strands of a conductive elastomer layer. The arranged conductive elements 663 then provide for electrical contact between the contact pads 653 and solder spheres 673 disposed on base member 652.

The present adapter assembly 650 shown in FIG. 8 using solder spheres 673 on base member 652 is preferred for advantageous use with land grid array packages. For example, in many cases land grid array packages include a mask surrounding the contact elements 653, e.g., land grid array pads. In other words, openings through the mask to the pads allow for electrical contact. As such, the pads may be inset from a lower surface of the package making electrical contact with a conductive elastomer ineffective. The solder spheres 673 provide for a force exerted on the lower portion of the conductive elastomer 662 which slightly raises the upper surface of the conductive surface allowing for improved electrical contact with such inset pads.

One skilled in the art will recognize that the adapter apparatus 650 of FIG. 8 may be modified with alternative structure from the other adapter assemblies described previously herein or as described further below. For example, but clearly not limited to such modifications, the adapter assembly 650 may be provided with a clam-type cover, a different type of actuator element, a differently configured floating member (e.g., a pyramid-like configuration), contact elements on the second side 674 of base member 652 that are not solder spheres (e.g., a pin structure may extend from base member 652), a conductive element layer 662 that includes z-axis or angled conductive elastomer strands, or any other conductive element layer having arranged conductive elements as previously described herein.

Figure 9A:
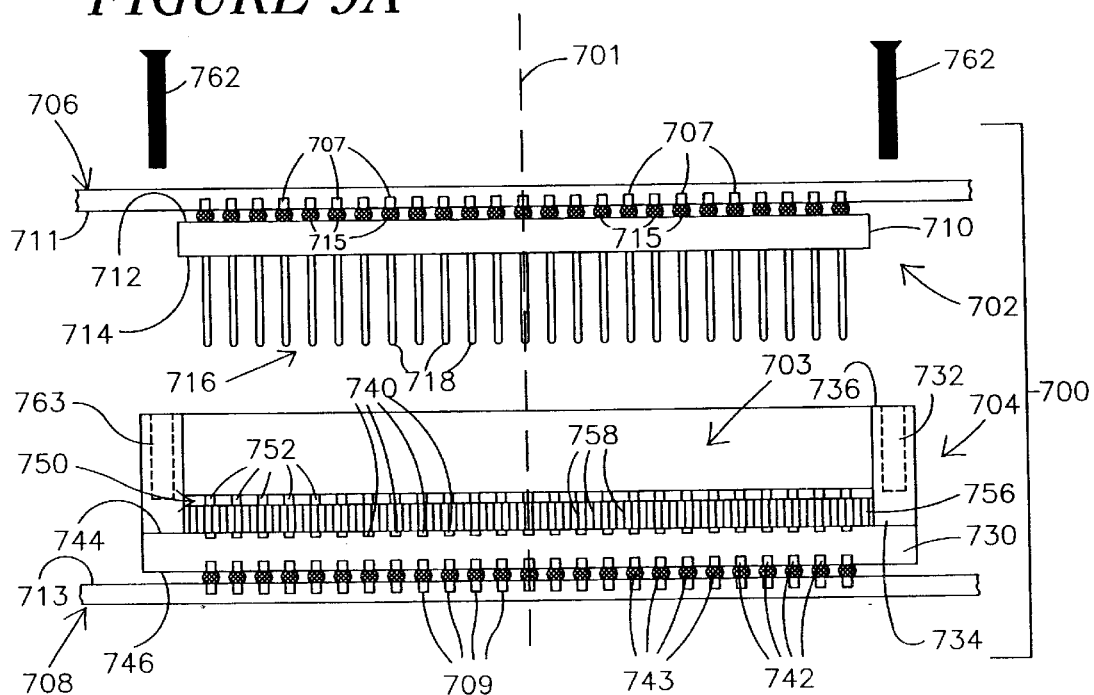
FIG. 9A is an unplugged exploded cross-section side view of a pluggable mounting assembly according to the present invention for use in mounting a mountable assembly on a target.
Figure 9B:
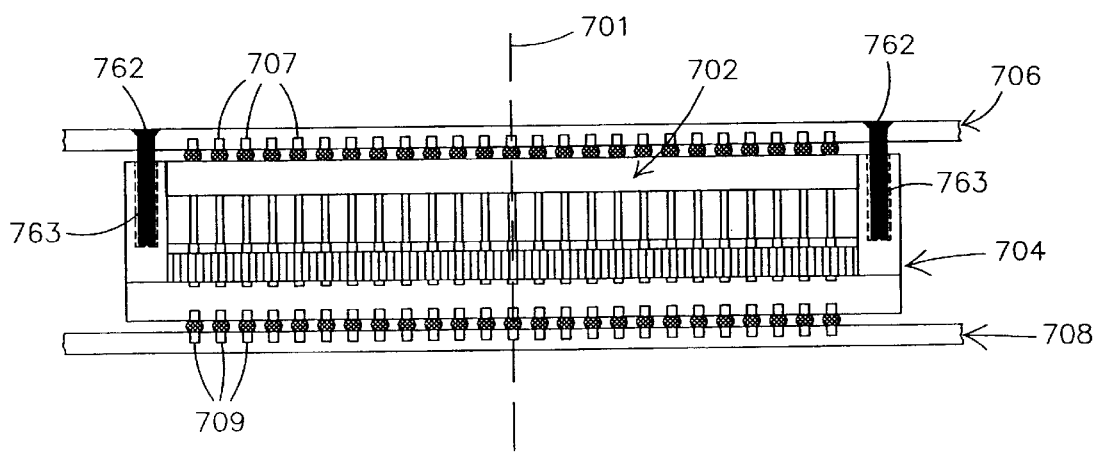
FIG. 9B is the pluggable mounting assembly of FIG. 9A, wherein the pin array portion thereof is plugged into the mounting base thereof according to the present invention.

With reference to FIGS. 9A–9B, a pluggable mounting assembly 700, e.g., a zero insertion force adapter assembly, shall be generally described below. Thereafter, a more detailed illustrative embodiment of a pluggable mounting assembly 840 shall be described with reference to FIGS. 10A–10D and FIG. 11.

As shown in FIG. 9A, the pluggable mounting assembly 700 is used to mount a mountable assembly 706 having a plurality of contact elements 707 disposed on a surface 711 thereof to a target board 708. The target board 708 includes a plurality of contact elements 709 disposed on a surface 713 thereof. Generally, the pluggable mounting assembly 700 includes a pin array portion 702 and a mounting base 704. The pin array portion 702 is receivable in a cavity 703 of the mounting base 704. In other words, the pin array portion 702 is pluggable into mounting base 704. As such, when the pin array portion 702 is electrically and physically connected to a mountable assembly 706 and when the mounting base 704 is electrically and physically connected to a target board 708, the mountable assembly 706 is pluggable via the pluggable mounting assembly 700 onto target board 708 with electrical connections being made therebetween.

The mountable assembly 706 may be any packaged device adapter assembly such as described herein, e.g., the assemblies of FIGS. 1–8 as shown therein or modified to some degree, a daughter printed circuit board with or without one or more different components mounted thereon, a test probe adapter assembly as described below with reference to FIGS. 10A–10D, or any other suitable mountable assembly 706 upon which the pin array portion 702 of the pluggable mounting assembly may be attached. The target board 708 may be any structure upon which the mounting base 704 of the pluggable mounting assembly 700 may be suitably attached, e.g., a printed circuit board having a plurality of contact elements 709. Preferably, the target board 708 includes structure suitable for surface mounting of the mounting base 704.

As described above, the pluggable mounting assembly 700 includes the pin array portion 702 and the mounting base 704. Preferably, the pin array portion 702 is surface mountable via the contact elements 715 thereof to the mountable assembly 706. Likewise, preferably, the mounting base 704 is surface mountable via the plurality of contact elements 742 thereof to target board 708. However, the pluggable mounting assembly 700 may be mounted to target board 708 in any suitable manner.

Pin array portion 702 includes a body member 710 extending along a mounting axis 701 between a first end 712 and a second end 714 thereof Preferably, first end 712 and second end 714 are planar surfaces generally orthogonal to the mounting axis 701.

The pin array portion 702 further includes conductive pin contact elements 716 used for establishing contact with the contact elements 707 of mountable assembly 706 and also used for establishing contact with a conductive element layer 756 of mounting base 704 as described further below. Preferably, the conductive pin contact elements 716 include a pin contact region 715 disposed at the first end 712 of the body member 710 and electrically connected to a portion 718 that extends from the second end 714 of the body member 710. Preferably, the conductive pin contact elements 716 include contact element portions 718 which extend from the second end 714 generally parallel to the mounting axis 701.

Preferably, the conductive pin contact elements 716 include pins inserted into drilled openings in body member 710. More preferably, such pins are configured including one or more features as described with reference to FIG. 11.

Figure 11:
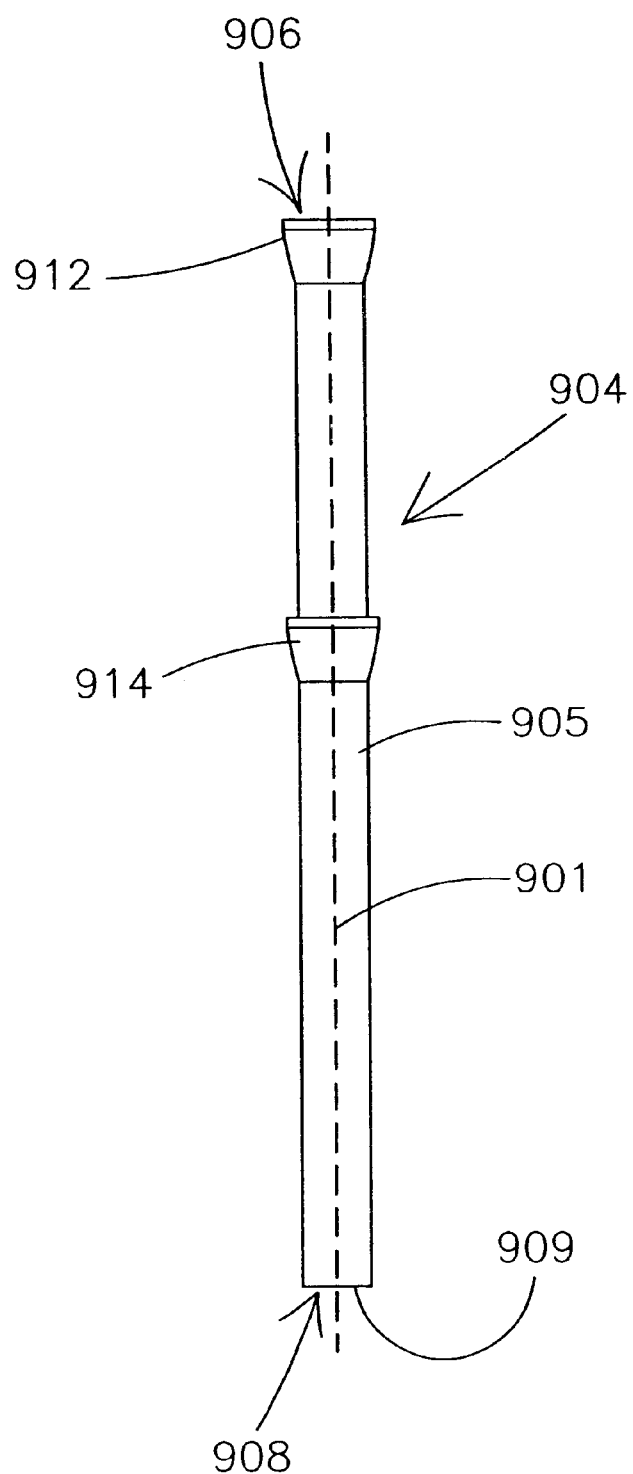
FIG. 11 is one illustrative embodiment of a contact pin useable in a pin array portion of the pluggable mounting assembly of FIGS. 9 and 10.

FIG. 11 shows a flat head dual barb contact pin 904. The contact pin 904 extends generally in the direction of the mounting axis 701 when used in a pin array portion 702 as shown in FIG. 9A. The contact pin 904 includes a main body portion 905 extending along a pin axis 901 from a first end 906 to a second end 908. The contact pin 904 may be formed of various materials. For example, the contact pin may be formed of a brass alloy and plated with a metal such as gold and/or nickel. Further, the contact pin 904 includes a first barb portion 912 at the first end 906. The first barb portion 912 extends outward from the body portion 905 and provides for sealing of the drilled hole through the body member 710 of the pin array portion 702 when inserted and seated in the drilled hole. This prevents solder from flowing into the drilled hole upon the surface mounting of the pin array portion 702 to the mountable assembly 706.

Further, the contact pin 904 includes a second barb portion 914 which also extends outward from the body portion 905. Second barb portion 914 is sized to assist in retaining the contact pin 904 in the drilled hole of the body member 710 of the pin array portion 702 when the contact pin 904 is inserted in the drilled hole.

Yet further, the second end 908 of the contact pin 904 is a generally flat end as shown by flat head 909. As used herein, a generally flat end refers to an end wherein the majority, i.e., 50% or greater, of the end surface is orthogonal to the pin axis 901. Preferably, at least a surface area at the second end 908 equal to or greater than 75% of the cross-sectional area of the body member 905 is orthogonal to the pin axis 901 at second end 908. More preferably, at least 90% of the cross-sectional area of the body member 905 is orthogonal to the pin axis 901 at second end 908. Most preferably, substantially the entire end 908 lies orthogonal to the pin axis 901. The flat head 909 of the contact pin 904 provides for superior contact between the contact pin 904 and the conductive element layer 756 of the mounting base 704, particularly when the conductive element layer 756 is a conductive elastomer layer with conductive strands therein.

The mounting base 704 includes a base member 730 having a first side 744 and a second side 746 facing in the opposite direction. The base member 730 includes a plurality of contact elements 740 disposed on the first side 744 and a plurality of contact elements 742 disposed on the second side 746 of the base member 730. Generally, the first and second sides 744, 746 are orthogonal to the mounting axis 701. For example, base member 730 may be a printed circuit board which connects contact elements 740 on the first side thereof to contact elements 742 on the second side thereof, such as with conventional printed conductive traces. Further, solder spheres 743 may be positioned in electrical contact with contact elements 742 for the purpose of surface mounting base 704 to target board 708.

The mounting base 704 further includes a wall member 732, preferably extending in the direction of the mounting axis 701 between a first end 736 and a second end 734. The second end 734 of the wall member 732 is adjacent the base member 730. As used herein, the term adjacent does not necessarily mean that the elements are in direct contact, as other structures may be positioned between the second end 734 and the base member 730.

The base member 730 and the wall member 732 define a cavity 703 sized to receive at least a portion of the body member 710 of pin array portion 702. Positioned in the cavity 703 is a conductive element layer 756 which includes a plurality of arranged conductive elements 758. The arranged conductive elements 758 are in electrical contact with the contact elements 740 on first side 744 of base member 730 and further are for contact with the pin contact elements 716 when the pin array portion 702 is plugged into mounting base 704.

Further, optionally positioned within the cavity 703 is an alignment structure 750. The alignment structure 750 may be used for various functions. For example, the alignment structure 750 may be provided for alignment of the conductive element layer 756 within cavity 703 as described with reference to FIGS. 10A–10B, or in the alternative may provide for alignment of the conductive pin elements 716 of the pin array portion 702 within cavity 703 such that alignment of the pin elements 716 to the contact elements 740 disposed on first surface 744 of base member 730 is accomplished. With such alignment and with the pin array portion 702 plugged into the mounting base 704, an electrical conductive path is formed from pin contact elements 716 through the arranged conductive elements 758 to contact elements 740 which are in electrical connection with contact elements 742 on the opposing side 746 of base member 730.

As shown in FIG. 9A, alignment structure 750 includes openings 752, e.g., square openings, having a cross-sectional area orthogonal to the mounting axis 701 that is larger than the cross-sectional area of conductive pin contact elements 716. This permits zero insertion force pluggability when pin array portion 702 is inserted into mounting base 704.

Further, conductive element layer 756 is preferably a conductive elastomer layer, such as a z-axis elastomer layer previously described herein. As such, and with the use of the flat head 909 on the terminating end of the conductive pin contact elements 716 as described with reference to FIG. 11, superior contact between the pin array portion 702 and the conductive elastomer layer is achieved. It will be readily apparent to one skilled in the art that the conductive element layer 756 may also be a slanted conductive elastomer layer as described previously herein, or the conductive element layer may include any other configuration of arranged conductive elements 758, such as those previously described herein, which provide suitable electrical connection between conductive pin contact elements 716 and the contact elements 740 is achieved.

FIG. 9A shows the pin array portion 702 and the mounting base 704 in an exploded unassembled view. FIG. 9B, on the other hand, shows the pin array portion 702 plugged into the mounting base 704 with the conductive pin contact elements 716 in contact with the conductive element layer 756. As such, a conductive path from the contact elements 707 of the mountable assembly 706 to the contact elements 709 of the target board 708 is achieved through the use of the pluggable mounting assembly 700 with no insertion force being necessary.

In one exemplary embodiment as shown in FIGS. 9A–9B, the pin array portion 702 is retained in mounting base 704 by a fastening system such as a system that includes screws 762 inserted through mountable assembly 706 and mated with inserts 763 in the wall member 732. However, such a retaining system is optional and any type of fastening system that allows for the plugging and unplugging of the pin array portion 702 with respect to mounting base 704 may be used, e.g., screws, clamps, releasable adhesive, etc.

Figure 10A:
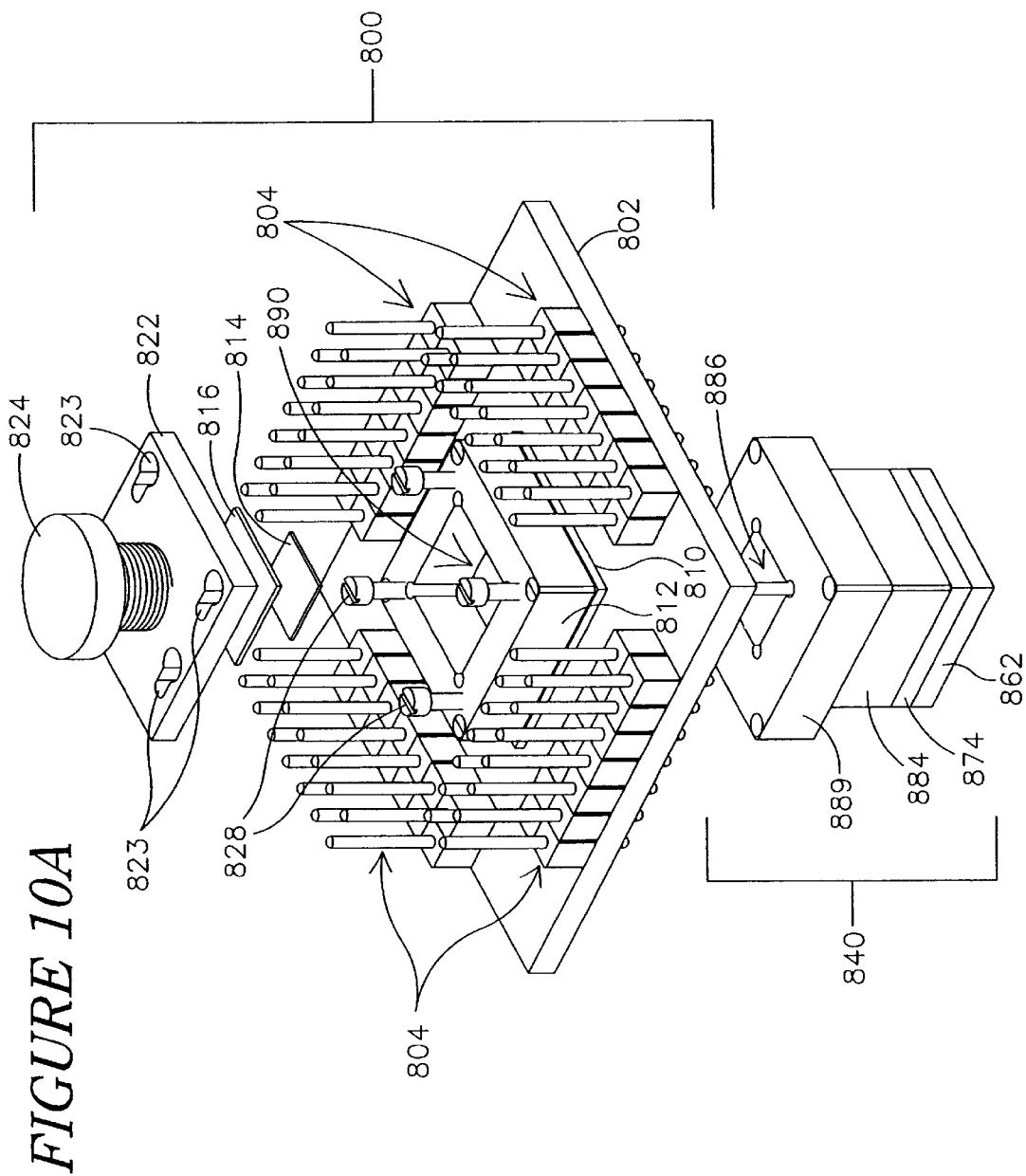
FIG. 10A is a top exploded perspective view of a packaged device adapter assembly and pluggable mounting assembly according to the present invention.
Figure 10B:
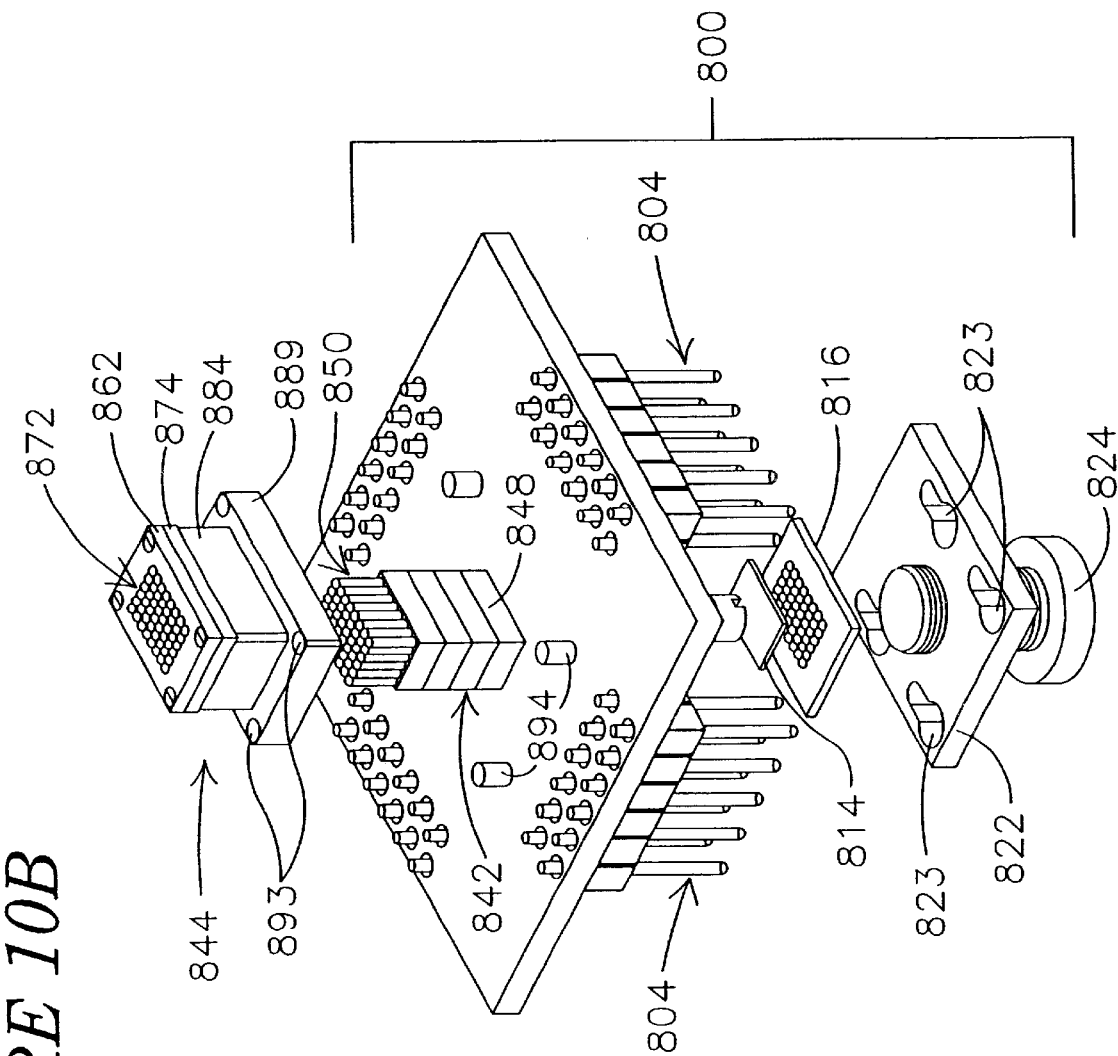
FIG. 10B is a bottom exploded perspective view of the packaged device adapter assembly and pluggable mounting assembly shown in FIG. 10A.
Figure 10C:
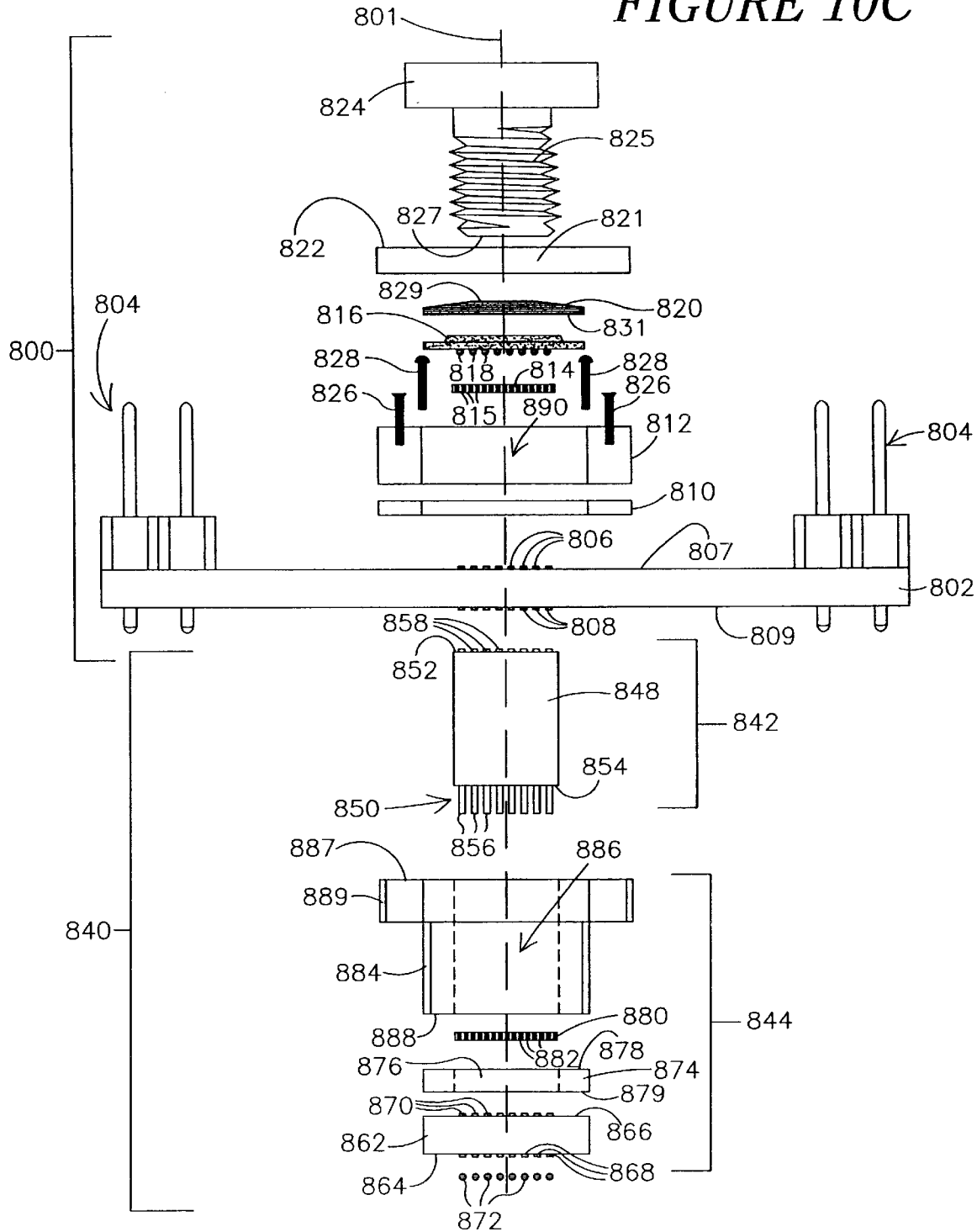
FIG. 10C is an exploded cross-section side view of the packaged device adapter assembly and pluggable mounting assembly of FIGS. 10A and 10B.
Figure 10D:
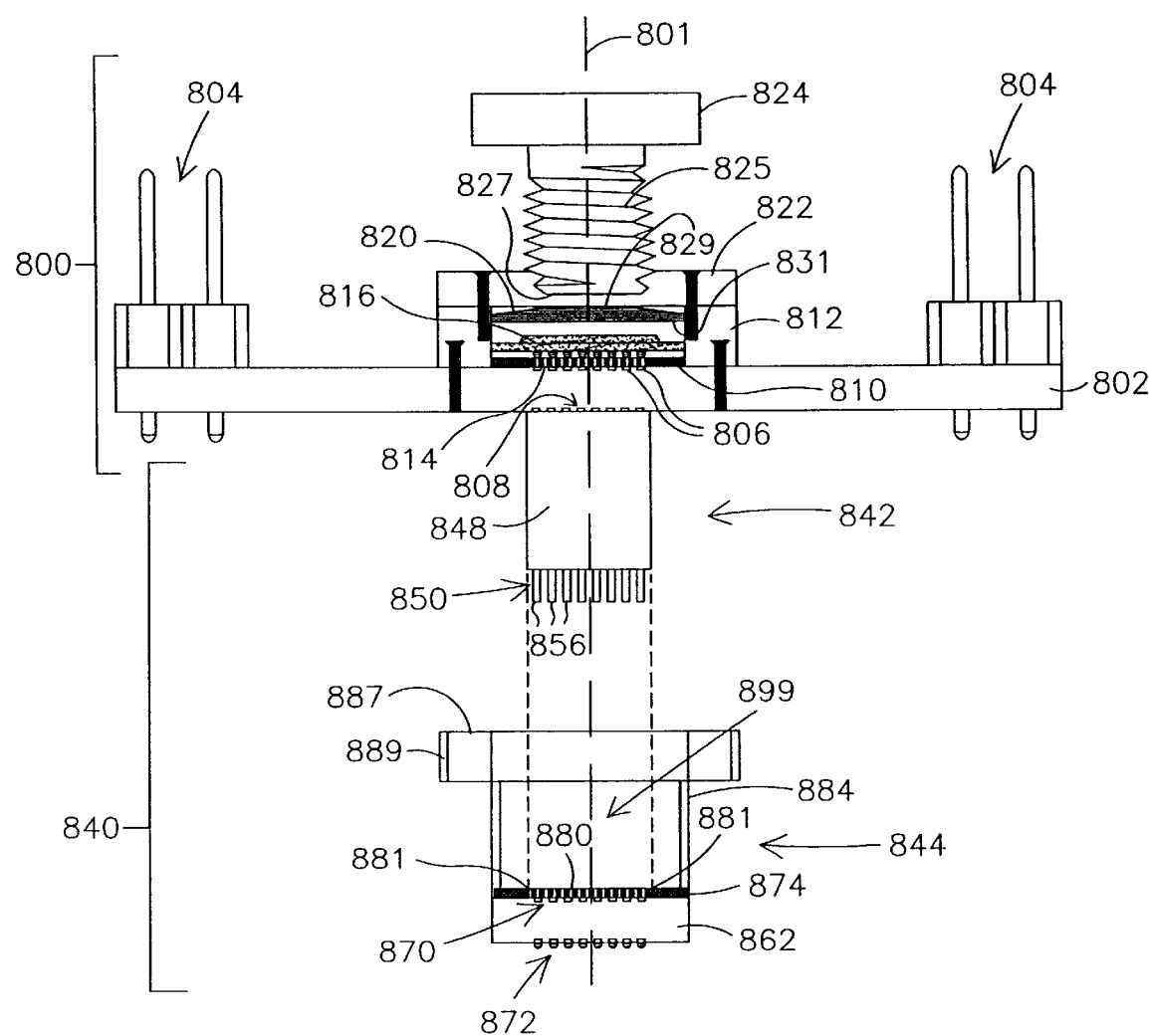
FIG. 10D is another cross-section side view of the assembled elements of the packaged device adapter assembly and pluggable mounting assembly of FIG. 10C, without the pin array portion plugged into the mounting base.

FIGS. 10A–10D show an illustrative embodiment of one use of an illustrative pluggable mounting assembly 840. The pluggable mounting assembly 840 is used with a test probe adapter assembly 800 having a packaged device 816 mounted therein. FIGS. 10A–10B are exploded top and bottom perspective views, respectively, of the test probe adapter assembly 800 and the pluggable mounting assembly 840 according to the present invention. FIG. 10C is an exploded illustrative cross-section side view of the test probe adapter assembly 800 and pluggable mounting assembly 840. The pluggable mounting assembly 840, as shown in FIG. 10C, includes a pin array portion 842 that is pluggable into a mounting base 844 according to the present invention. FIG. 10D shows, in an illustrative cross-section view, the test probe adapter assembly 800 as assembled, unlike the exploded view shown in FIG. 10C, with the pin array portion 842 soldered to the test probe adapter assembly 800. FIG. 10D further shows the mounting base 844 assembled, unlike the exploded view shown in FIG. 10C.

The following description of the test probe adapter assembly 800 and pluggable mounting assembly 840 shall be provided with reference to all of the FIGS. 10A–10D, as opposed to any particular figure thereof, because many features shown can be better understood by reference to all of the drawings as opposed to any particular drawing. Although the pluggable mounting assembly 840 in this illustrative embodiment is attached to test probe adapter assembly 800, the pluggable mounting assembly 840 may be used with any mountable assembly suitably attached thereto and is clearly not limited to this or any other test probe adapter assembly. For example, as previously described herein, the pluggable mounting assembly 840 may be used to mount any suitable mounting assembly to a desired target. As such, only a brief summary description of the test probe adapter assembly 800 shall be given below.

Test probe adapter assembly 800 includes base member 802 which is preferably a printed circuit board having a plurality of contact elements 806, e.g., contact pads, disposed on a first side 807 thereof and a second set of contact elements 808, e.g., contact pads, disposed on a second side 809 of the base member 802. Preferably, the first and second sides 807, 809 are opposing faces of a printed circuit board including conductive traces used to electrically connect contact elements 806 and 808. Further, the contact elements 806, 808 are electrically connected, such as by conductive traces or lines, to test pins 804 located about the perimeter of the base member 802. As known in the art, the test pins 804 are used for testing purposes.

The test probe adapter assembly 800 further includes a wall member 812 that is positioned adjacent the base member 802 to form a cavity 890 therewith. Cavity 890 is sized to receive the packaged device 816, e.g., a ball grid array package, having solder spheres 818 disposed on a mounting surface thereof.

A cover member 822 is positioned over the cavity 890 to close the cavity when desired. The cover member 822 includes key slot holes 823 for easy locking and unlocking with mating oval head screws 828. Further, the cover member 822 includes a threaded insert 821 for receiving an actuator element 824 having a threaded portion 825 for mating with the insert 821.

Further, as more distinctly shown in FIG. 10D, the test probe adapter assembly 800 includes an alignment structure 810 positioned within the cavity 890 to align a conductive element layer 814 including a plurality of arranged conductive elements 815, e.g., a conductive elastomer layer as previously described herein, within the cavity 890. As shown in FIG. 10D, the conductive element layer 814 is positioned adjacent the plurality of contact elements 806 disposed on side 807 of base member 802 and is aligned in the cavity 890 by alignment structure 810.

Also positioned in the cavity 890 is a floating member 820 which in combination with actuator element 824 provides a desired force upon a packaged device 816 positioned in the cavity 890 and having conductive elements 818 to be placed in electrical contact with the conductive element layer 814. Preferably, the floating member 820 has an upper surface 829 that is sized as a function of the surface 827 of the actuator element 824 that comes in contact therewith when a force is inserted on packaged device 816. In other words, the surface area of the face 827 is preferably substantially equivalent to the surface area of side 829 of the floating member 820. The floating member is then tapered down from the upper side 829 to a lower side 831 that is configured as a function of the packaged device 816. In this particular embodiment, the lower surface 831 of the floating member 820 is substantially horizontal to the mounting axis 801 of the test probe adapter assembly 800 shown in combination with pluggable mounting assembly 840. This pyramid-like configuration is a configuration which provides enhanced force distribution equalization upon the packaged device 816. In such a manner, force is applied by the actuator 824 to the floating member 820 and therefore onto packaged device 816 such that the solder balls 818 of the packaged device 816 all have an equal force distributed thereon and are equally in contact with the conductive element layer 814.

The wall member 812 is preferably connected to the base member 802 by a set of screws 826. However, any fastening technique may be used that suitably provides such coupling.

It will be recognized that many modifications may be made to the test probe adapter assembly 800 using structure and techniques as described elsewhere herein with respect to other packaged device assemblies. As such, it will be recognized that this is only an illustrative test probe adapter device assembly and that an unlimited number of different configurations for such an assembly are conceivable.

The pin array portion 842 includes body member 848 which extends along mounting axis 801 between a first end 852 and a second end 854. The first and second ends generally lie orthogonal to the mounting axis 801. Preferably, according to this particular illustrative embodiment, the pin array portion includes a plurality of contact pins 850 inserted in drilled holes of body member 848. As such, each of the plurality of contact pins 850 include a pin contact region 858 at the first side 852 of the body member 848 and a portion 856 of the pin contact member 850 which extends generally parallel to the mounting axis 801 from the second end 854 with the remaining portion of the contact pin 850 being surrounded by material of body member 848. As such, the contact pins 850 are isolated from one another. Preferably, the contact pins inserted in drilled holes of body member 848 are the flat head dual barb contact pins as previously described herein with reference to FIG. 11. However, any other suitable contact element or pin may be used.

The mounting base 844 includes base member 862 which includes a plurality of contact elements 870, e.g., contact pads, disposed on a first side 866 thereof and a plurality of contact elements 868, e.g., contact pads, disposed on a second opposing side 864 thereof. The contact elements 870 and contact elements 868 are electrically connected. For example, the base member 862 may be a printed circuit board having suitable interconnect conductive lines or traces for adequately connecting the contact elements 870 and 868. Optionally, solder spheres 872 are applied to contact elements or contact pads 868 of base member 862.

Further, mounting base 844 includes a wall member 884 which extends along mounting axis 801 from a first end 887 to a second end 888. As shown in FIG. 10C, wall member 884 defines an opening 886 therethrough along mounting axis 801. Wall member 884 further includes a flange member 889 suitable for use in connecting the mounting base 844 to another structure. For example, as shown in FIG. 10B, flange 889 may include mounting structure 893 compatible with mounting structure 894 for use in providing stability between the mounting base 844 and test probe adapter assembly 800.

As shown in FIG. 10D, wall member 884 and base member 862 (and optionally alignment structure 874) define cavity 899 sized to receive at least a portion of the body member 848 of pin array portion 842. Within the cavity 899 lies at least a portion of alignment structure 874 which is used to align conductive element layer 880 therein. Preferably, conductive element layer 880 is a z-axis conductive elastomer, although other suitable conductive element layers may be used as previously described herein.

Alignment structure 874 in this particular illustrative embodiment is positioned between wall member 884 and base member 862. However, alignment structure 874 may be a structure positioned only in the cavity and as such wall member 884 would lie directly adjacent base member 862. Alignment structure 874 serves multiple functions. First, as described above, alignment structure 874 aligns conductive elastomer layer 880 within the cavity 899 such that the conductive elastomer is in contact with the contact elements 870 on the first side 866 of base member 862 and such that appropriate contact is made with contact pins 850 when the pin array portion 842 is inserted or plugged into the mounting base 844.

Second, the alignment structure acts as an elastomer stop and protects the elastomer from excess compression by the pin array portion 842. To perform this function, the opening 876 in the alignment structure 874 is sized such that at least a portion of second end 854 of the pin array portion 842 comes in contact therewith when the pin array portion 842 is received within cavity 899. For example, the cross-sectional area of opening 876 orthogonal to mounting axis 801 may be less than the cross-sectional area of the body member 848 orthogonal to the mounting axis 801. As such, the second end 854 comes in contact with the alignment structure 874 when it is inserted in the cavity 899 and the contact pins 850 are limited in the amount of compression they assert on the elastomer layer 880. Exemplary points of contact are noted in FIG. 10D at reference numerals 881.

The pluggable mounting assembly 840 may be sized such that the mounting base 844 is very small and as such provides a surface mount base that is just slightly larger than an actual integrated circuit. Further, the zero insertion force plugging and unplugging for the test probe adapter 800 to the mounting base 844 via the pin array portion 842 provides for an unlimited number of insertion cycles without replacement of the elastomer. Yet further, the pluggable mounting assembly 840 may be used in very high speed applications.

All patents and references cited herein are incorporated in their entirety as if each were incorporated separately. This invention has been described with reference to illustrative embodiments and is not meant to be construed in a limiting sense. As described previously, one skilled in the art will recognize that various other illustrative adapter assembly embodiments may be provided which utilize various combinations of the elements described herein. Various modifications of the illustrative embodiments, as well as additional embodiments of the invention and combinations of various elements herein, will be apparent to persons skilled in the art upon reference to this description. It is therefore contemplated that the patented claims will cover any such modifications or embodiments that may fall within the scope of the present invention as defined by the accompanying claims.

What is claimed is:

1. A pluggable mounting apparatus for mounting a mountable structure having a plurality of contact elements on a surface thereof to a target having a plurality of contact elements on a surface thereof, the pluggable mounting apparatus comprising:

a pin array portion comprising a body member extending along a mounting axis between a first end and a second end, wherein the pin array portion comprises a plurality of pin contact elements for electrical connection with the plurality of contact elements of the surface of the mountable structure, and further wherein at least portions of the plurality of pin contact elements extend from the second end of the body member;

a mounting base comprising a base member and a wall member extending therefrom defining a cavity along the mounting axis sized to receive at least a portion of the body member of the pin array portion, wherein the base member is positioned orthogonal to the mounting axis and comprises a first set of contact elements and a second set of contact elements, wherein the first and second sets of contact elements are electrically connected and disposed on opposing sides of the base member, wherein the first set of contact elements is located within the cavity and the second set of contact elements is for electrical connection with the plurality of contact elements on the surface of the target; and a conductive element layer comprising a plurality of arranged conductive elements, wherein the conductive element layer is positioned in the cavity for electrical contact between the plurality of arranged conductive elements and the first set of contact elements and also for electrical contact between the plurality of arranged conductive elements and the at least portions of the plurality of pin contact elements extending from the second end of the body member of the pin array portion when the at least a portion of the body member of the pin array portion is received in the cavity.

2. The apparatus of claim 1, wherein the apparatus further comprises an alignment structure positionable in the cavity adjacent the base member, wherein the alignment structure comprises an opening to receive and align the conductive element layer within the cavity.

3. The apparatus of claim 1, wherein the apparatus further comprises an alignment structure positionable in the cavity, wherein the alignment structure comprises one or more openings configured as a function of the at least portions of the plurality of pin contact elements extending from the second end of the body member, the one or more openings to guide the at least portions of the plurality of pin contact elements for contact with the conductive element layer within the cavity.

4. The apparatus of claim 1, wherein the apparatus further comprises an alignment structure positionable in the cavity, wherein the alignment structure comprises an opening sized such that the alignment structure makes contact with the second end of the body member of the pin array portion when the at least a portion of the body member of the pin array portion is received in the cavity.

5. The apparatus of claim 1, wherein the conductive element layer is a conductive elastomer layer.

6. The apparatus of claim 1, wherein one or more of the at least portions of the plurality of pin contact elements extending from the second end of the body member terminates in a flat end lying orthogonal to the mounting axis for contact with the conductive element layer when the at least a portion of the body member of the pin array portion is received in the cavity.

7. The apparatus of claim 1, wherein one or more of the plurality of pin contact elements comprise a contact pin element extending through the body member from the first end to the second end and terminating beyond the second end at a pin contact end for contact with the conductive element layer when the at least a portion of the body member of the pin array portion is received in the cavity.

8. The apparatus of claim 7, wherein one or more of the plurality of pin contact elements are flat head dual barb pins extending through the body member.

9. The apparatus of claim 1, wherein the second set of contact elements of the base member for contact with the plurality of contact elements on the surface of the target comprises solder spheres.

10. The apparatus of claim 1, wherein the mountable structure includes a test probe adaptor structure having a plurality of contact elements on a surface thereof, wherein the plurality of pin contact elements include a plurality of contact regions for electrical contact with the plurality of contact elements on the surface of the test probe adaptor structure.

11. A mounting apparatus for use with a structure having a plurality of pins extending therefrom, the apparatus comprising:

a mounting base including a base member and a wall member extending therefrom, the base member and wall member defining a cavity along a mounting axis sized to receive the structure having the plurality of pins extending therefrom, wherein the base member is positioned orthogonal to the mounting axis and comprises a first set of contact elements within the cavity electrically connected to a second set of contact elements, the first and second sets of contact elements disposed on opposing sides of the base member;

a conductive element: layer comprising a plurality of arranged conductive elements, wherein the conductive element layer is positioned in the cavity such that the plurality of arranged conductive elements are in electrical contact with the first set of contact elements of the base member and also in electrical contact with the plurality of pins of the structure when received in the cavity, wherein the conductive element layer comprises a conductive elastomer layer; and an alignment structure positionable in the cavity, wherein the alignment structure comprises an opening sized such that the alignment structure makes contact with the structure having the plurality of pins extending therefrom when the structure is received in the cavity.

12. The apparatus of claim 11, wherein the alignment structure is positionable in the cavity adjacent the base member, wherein the alignment structure comprises an opening to receive and align the conductive element layer within the cavity.

13. The apparatus of claim 11, herein the alignment structure is positionable in the cavity, wherein the alignment structure comprises one or more openings configured as a function of the plurality of pins of the structure to guide the plurality of pins into contact with the conductive element layer when the structure is received within the cavity.

14. The apparatus of claim 1, wherein the second set of contact elements of the base member comprise solder spheres.

15. An adapter apparatus for receiving a packaged device having a plurality of contact pads disposed on a surface thereof, the apparatus comprising:

a base member including a first side and an opposing second side, wherein the base member includes a plurality of solder spheres on the first side thereof electrically connected to a plurality of contact elements on the second side;

a perimeter wall member having a length along an adapter axis between a first end of the wall member and a second end of the wall member, wherein the first end of wall member is positioned adjacent the base member;

a conductive element layer including a plurality of arranged conductive elements, the conductive element layer positioned at the first end of the perimeter wall member orthogonal to the adapter axis, wherein the perimeter wall member and the base member define a socket cavity to receive the packaged device with the plurality of contact pads thereof adjacent the conductive element layer;

a cover member positioned at the second end of the perimeter wall member to close the socket cavity, wherein the cover member is movable to allow the packaged device to be removed from the socket cavity;

a floating member movable in the socket cavity; and an actuator element operable to provide a force on the floating member such that a corresponding force is distributed to the packaged device when received in the socket cavity such that the plurality of contact pads thereof are in electrical contact with the arranged conductive elements of the conductive element layer.

16. The apparatus of claim 15, wherein the actuator element is associated with the cover member.

17. The apparatus of claim 16, wherein the actuator element is a threaded element movable in a threaded insert of the cover member.

18. The apparatus of claim 17, wherein the threaded element includes a heat sink head portion with a threaded portion extending therefrom.

19. The apparatus of claim 15, wherein the floating member is a plate member having a surface configured as a function of a surface of the packaged device, wherein the surface of the plate member is positioned in direct contact with the surface of the packaged device when the packaged device is received in the socket cavity.

20. The apparatus of claim 15, wherein the packaged device is one of a land grid array package.

21. The apparatus of claim 15, wherein the floating member includes a first surface configured as a function of a surface of the packaged device and a second opposing surface configured as a function of the actuator element, the second surface having an area substantially equal to a contact area of the actuator element.

22. The apparatus of claim 21, wherein the floating member is of a pyramid-like configuration.

23. The apparatus of claim 15, wherein the cover member includes a hinged member and a closure structure operable to latch the hinged member in a desired position relative to the perimeter wall member.

24. The apparatus of claim 15, wherein the apparatus further includes an alignment structure positioned in the socket cavity to align the contact pads of the packaged device with the plurality of solder spheres of the base member.

25. The apparatus of claim 15, wherein the conductive element layer is a conductive elastomer layer.

* * * * *

UNITED STATES PATENT AND TRADEMARK OFFICE
CERTIFICATE OF CORRECTION

PATENT NO.      : 6,394,820 B1
DATED           : May 28, 2002
INVENTOR(S)     : Ilavarasan Palaniappa et al.

It is certified that error appears in the above-identified patent and that said Letters Patent is hereby corrected as shown below:

<u>Title page,</u>
Item [57], ABSTRACT,
Line 13, please delete "array portion is received in the cavity. Au adapter apparatus" and insert -- array portion is received in the cavity. An adapter apparatus --;

<u>Column 24,</u>
Line 44, please delete "herein" and insert -- wherein --;
Line 51, please delete "The apparatus of claim 1" and insert -- The apparatus of claim 11 --.

Signed and Sealed this

Twenty-second Day of October, 2002

*Attest:*

*Attesting Officer*

JAMES E. ROGAN
*Director of the United States Patent and Trademark Office*